(12) United States Patent
Andosca et al.

(10) Patent No.: US 12,483,163 B2
(45) Date of Patent: Nov. 25, 2025

(54) PIEZO-ELEMENTS FOR WEARABLE DEVICES, INCLUDING FITNESS TRACKERS, SMART WATCHES AND THE LIKE

(71) Applicant: Inviza LLC, Austin (Cedar Park), TX (US)

(72) Inventors: Robert G. Andosca, Austin (Cedar Park), TX (US); Todd Richard Christenson, Albuquerque, NM (US); Marcus Taylor, Austin (Cedar Park), TX (US)

(73) Assignee: Inviza Corporation, Cambridge, MA (US)

( * ) Notice: Subject to any disclaimer, the term of this patent is extended or adjusted under 35 U.S.C. 154(b) by 351 days.

(21) Appl. No.: 17/573,061

(22) Filed: Jan. 11, 2022

(65) Prior Publication Data

US 2022/0131482 A1 Apr. 28, 2022

Related U.S. Application Data

(63) Continuation of application No. 17/373,690, filed on Jul. 12, 2021.
(Continued)

(51) Int. Cl.
*H02N 2/18* (2006.01)
*A43B 13/28* (2006.01)
(Continued)

(52) U.S. Cl.
CPC ............. *H02N 2/188* (2013.01); *A43B 13/28* (2013.01); *H02N 2/181* (2013.01);
(Continued)

(58) Field of Classification Search
CPC ...... H02N 2/181; H02N 2/188; H10N 30/093; H10N 30/098; H10N 30/802;
(Continued)

(56) References Cited

U.S. PATENT DOCUMENTS 8,348,841 B2     1/2013  Varadan
9,106,322 B2 *   8/2015  Bagshaw ................ G01S 15/96
(Continued)

OTHER PUBLICATIONS

Requirement for Restriction/Election Mailed on Dec. 7, 2023 for U.S. Appl. No. 17/373,690, 7 page(s).
(Continued)

*Primary Examiner* — Emily P Pham
*Assistant Examiner* — Monica Mata
(74) *Attorney, Agent, or Firm* — Kaplan Breyer Schwarz, LLP

(57) ABSTRACT

Aspects of the present disclosure describe systems, methods, and structures that scavenge mechanical energy to provide electrical energy to a wearable, where the mechanical energy is scavenged by a bending-strain-based transducer that includes a non-resonant energy harvester. By employing a non-resonant energy harvester that operates in bending mode, more electrical energy can be generated that possible with prior-art energy harvesters. In some embodiments, the bending-strain-based transducer also includes a sensor and/or a haptic device. Some transducers in accordance with the present disclosure comprise a piezoelectric layer comprising a low-K piezoelectric material, such as aluminum nitride, which enables generation of higher voltage and power/energy output and/or a thinner transducer. As a result, transducers in accordance with the present disclosure can be included in wearables for which large transducer thickness would be problematic, such as sole members (e.g., shoe insoles, midsoles or outsoles), garments, bras, handbags, backpacks, and the like.

19 Claims, 11 Drawing Sheets

Related U.S. Application Data

(60) Provisional application No. 63/060,455, filed on Aug. 3, 2020, provisional application No. 63/050,334, filed on Jul. 10, 2020.

(51) Int. Cl.
| | | |
|---|---|---|
| *H01L 41/04* | (2006.01) | |
| *H01L 41/08* | (2006.01) | |
| *H01L 41/187* | (2006.01) | |
| *H01L 41/193* | (2006.01) | |
| *H01L 41/39* | (2013.01) | |
| *H01L 41/45* | (2013.01) | |
| *H10N 30/00* | (2023.01) | |
| *H10N 30/093* | (2023.01) | |
| *H10N 30/098* | (2023.01) | |
| *H10N 30/80* | (2023.01) | |
| *H10N 30/853* | (2023.01) | |
| *H10N 30/857* | (2023.01) | |

(52) U.S. Cl.
CPC ......... *H10N 30/093* (2023.02); *H10N 30/098* (2023.02); *H10N 30/101* (2024.05); *H10N 30/802* (2023.02); *H10N 30/853* (2023.02); *H10N 30/8554* (2023.02); *H10N 30/857* (2023.02)

(58) Field of Classification Search
CPC ............... H10N 30/853; H10N 30/857; H10N 30/1071; H10N 30/8554; A43B 13/28
USPC ........................................................ 310/318
See application file for complete search history.

(56) References Cited

U.S. PATENT DOCUMENTS

| | | | |
|---|---|---|---|
| 10,131,993 B2 | 11/2018 | Varadan et al. | |
| 10,231,623 B2 | 3/2019 | Varadan et al. | |
| 10,438,772 B2 | 10/2019 | Varadan et al. | |
| 10,653,316 B2 | 5/2020 | Varadan et al. | |
| 2005/0192129 A1* | 9/2005 | Kuwabara | A63B 60/46 |
| | | | 473/520 |
| 2016/0183835 A1 | 6/2016 | Varadan | |
| 2016/0222539 A1 | 8/2016 | Varadan et al. | |
| 2017/0208890 A1 | 7/2017 | Torvinen et al. | |
| 2017/0226643 A1 | 8/2017 | Varadan et al. | |
| 2017/0354372 A1 | 12/2017 | Varadan et al. | |
| 2018/0153512 A1* | 6/2018 | Akkaraju | G01S 7/521 |
| 2018/0325407 A1 | 11/2018 | Varadan et al. | |
| 2019/0048473 A1 | 2/2019 | Varadan et al. | |
| 2019/0086361 A1 | 3/2019 | Varadan et al. | |
| 2020/0006035 A1 | 1/2020 | Varadan et al. | |
| 2022/0014120 A1 | 1/2022 | Andosca et al. | |

OTHER PUBLICATIONS

Robert Andosca et al., "Experimental and theoretical studies on MEMS piezoelectric vibrational energy harvesters with mass loading", "Sensors and Actuators A: Physical", Feb. 28, 2012, Publisher Elsevier B.V., doi:10.1016/j.sna.2012.02.028, pp. 76-87.

Non-Final Rejection Mailed on Apr. 3, 2024 for U.S. Appl. No. 17/373,690, 27 page(s).

Final Rejection Mailed on Dec. 30, 2024 for U.S. Appl. No. 17/373,690, 27 page(s).

* cited by examiner

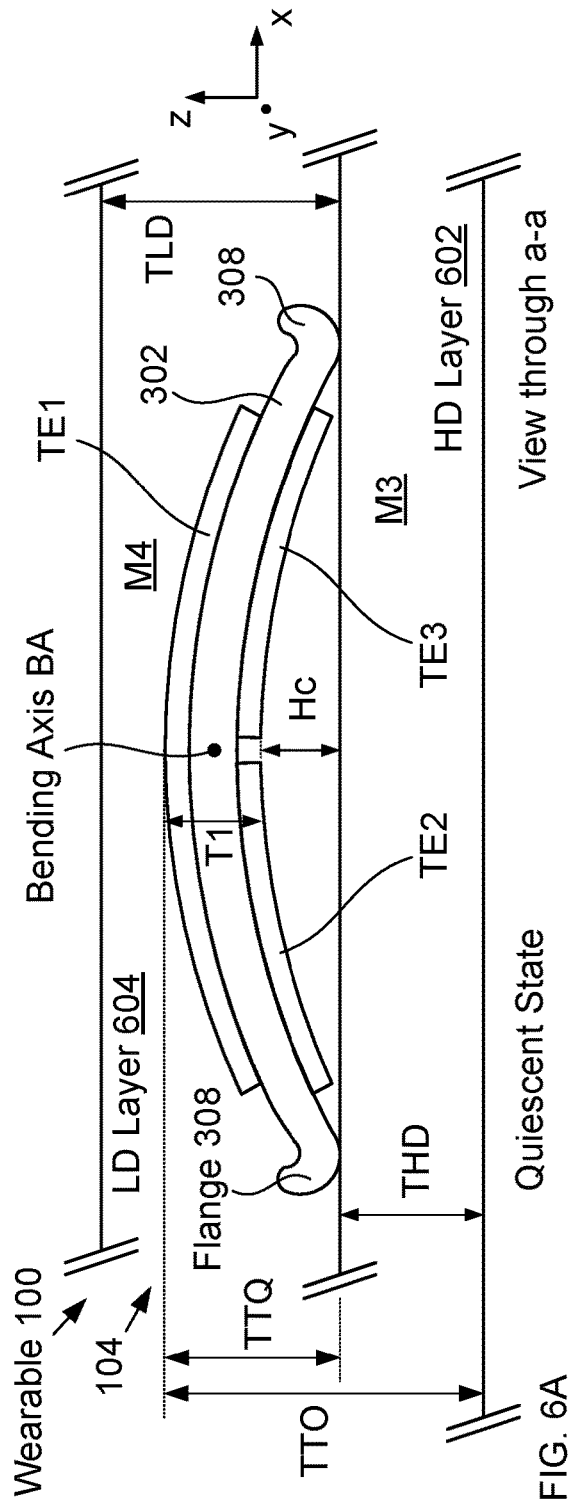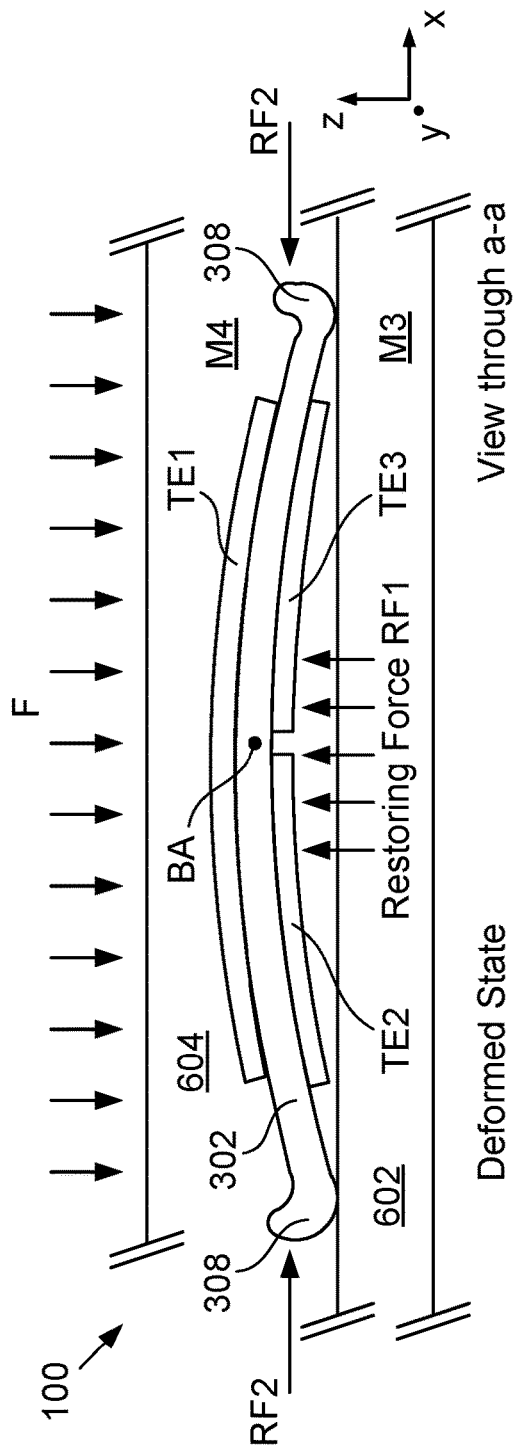
FIG. 6A
FIG. 6B

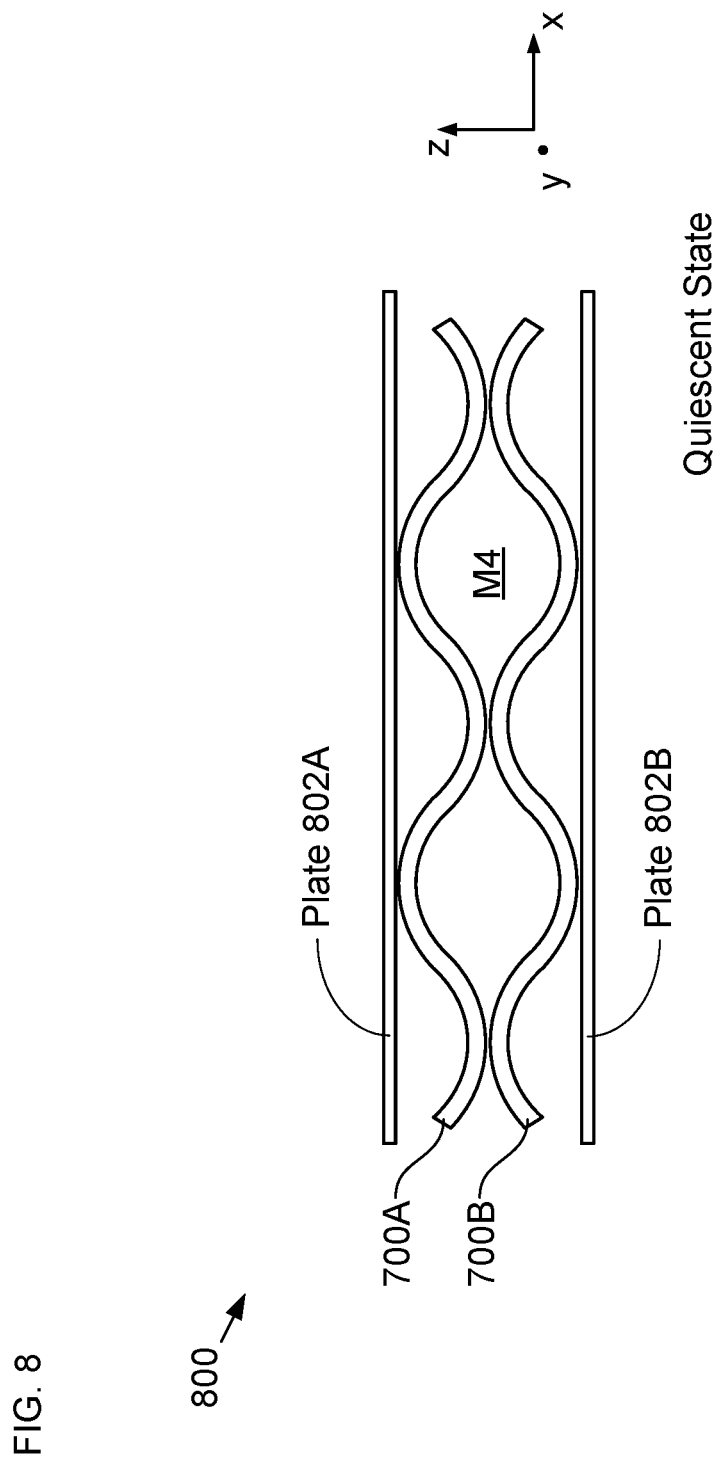

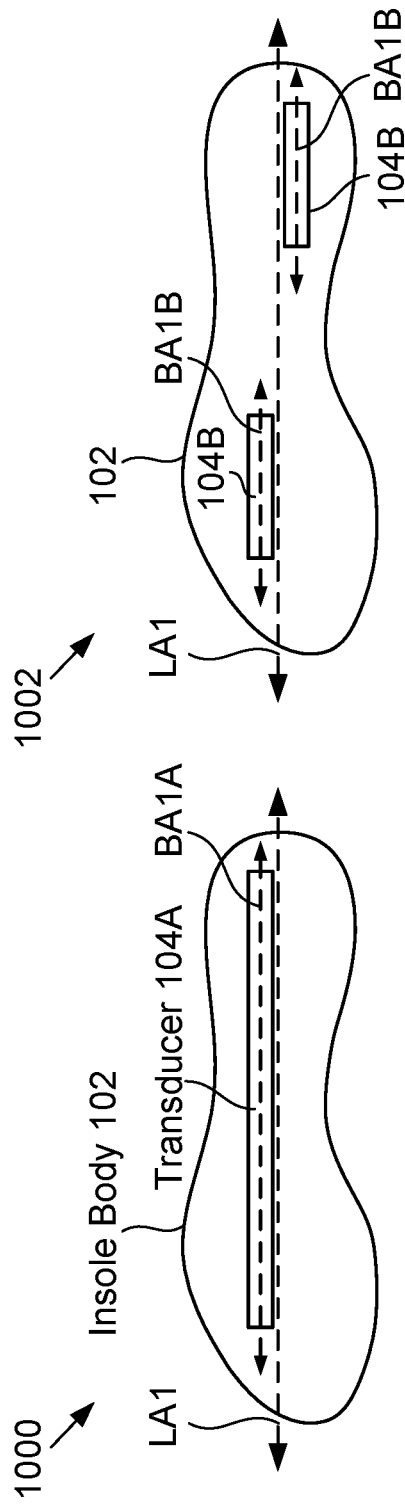
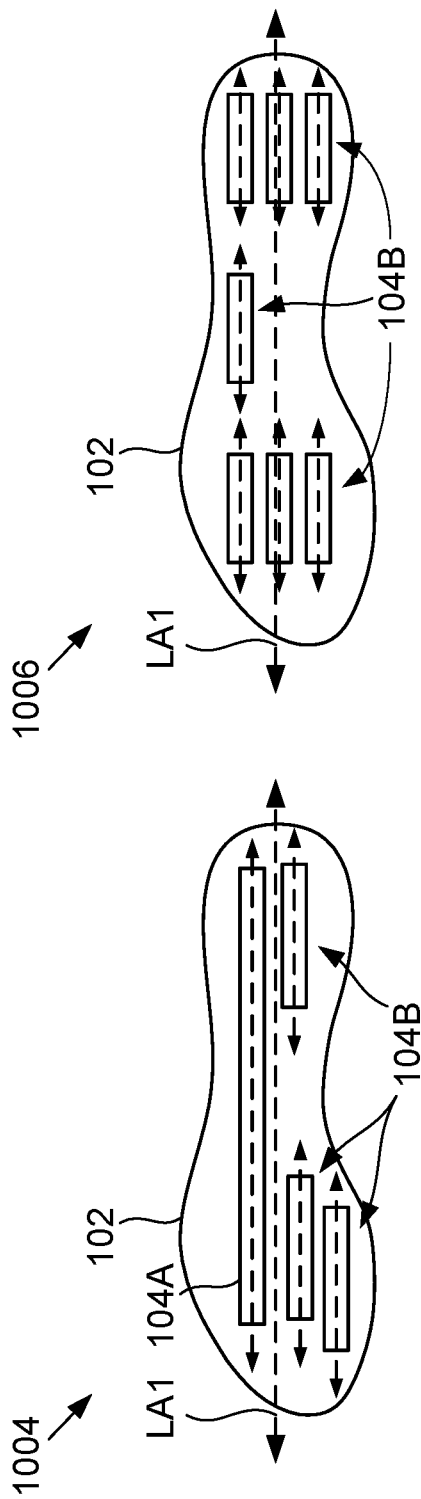

PIEZO-ELEMENTS FOR WEARABLE DEVICES, INCLUDING FITNESS TRACKERS, SMART WATCHES AND THE LIKE

CROSS REFERENCE TO RELATED APPLICATIONS

This application is a continuation of co-pending U.S. Non-provisional patent application Ser. No. 17/373,690, filed Jul. 12, 2021, entitled "Piezo-Elements for Wearable Devices,", which claims the benefit of U.S. Provisional Application Ser. No. 63/050,334, filed Jul. 10, 2020, entitled "Piezo-Elements for Wearable Devices," and U.S. Provisional Application Ser. No. 63/060,455, filed Aug. 3, 2020, entitled "Corrugated Piezo-Elements for Wearable Devices, ", each of which is incorporated herein by reference. If there are any contradictions or inconsistencies in language between this application and one or more of the cases that have been incorporated by reference that might affect the interpretation of the claims in this case, the claims in this case should be interpreted to be consistent with the language in this case.

TECHNICAL FIELD

The present disclosure relates to smart wearable systems in general, and, more particularly, to self-powered sensors and actuators suitable for inclusion in a wearable, such as smart clothing for use by humans and/or animals such as, garments, footwear, accessories, and the like.

BACKGROUND

Wearables, such as fitness trackers and smart watches have become increasingly popular over the past few years. These devices and systems have evolved to the point at which they can connect with other devices, like computers and smartphones, thereby enhancing their overall capabilities.

Unfortunately, one area that remains a challenge is providing power to wearables—particularly as more systems and sub-systems are included to augment their capabilities. For example, many contemporary wearables include rechargeable batteries. Unfortunately, rechargeable batteries must be frequently connected to a charging station of some sort, during which time the wearable is typically out of service.

Furthermore, the capacity of many rechargeable batteries (e.g. Lithium ion "Li+" or Lithium polymer "LiPo", etc.) degrades over time to a point where the wearable becomes inoperative.

The need for a self-powered wearable that requires little or no downtime for recharging remains, as yet, unmet in the prior art.

SUMMARY

The present disclosure is directed toward self-powered wearables for users/subjects such as humans, animals, robotics, exoskeletons, and the like. Embodiments in accordance with the present disclosure are suitable for use in accessories and/or garments for humans, such as clothing, shoes, sandals, exercise equipment and clothing, cell phone cases, luggage (e.g., suitcases, backpacks, etc.), purses, undergarments (e.g., bras, socks, sole members (e.g., insoles, midsoles, outsoles, etc.), human-machine interfaces (e.g., joysticks, position-sensing-gloves, etc.), smart gloves, and the like, as well as garments and/or accessories for animals, such as horseshoes, leashes, collars, and the like.

Like the prior art, embodiments in accordance with the present disclosure include transducers that generate electrical energy in response to an applied force. In sharp contrast to the prior art, however, transducers disclosed herein have a quiescent shape that is curved (or "bent") about at least one bending axis. The transducers are configured to generate electrical energy when they are flattened relative to their bending axis (or axes) in response to the applied force, as well as when returning to their quiescent state upon removal of the applied force. Furthermore, transducers in accordance with the present disclosure are dimensioned and arranged to mitigate compression of their piezoelectric material by the applied force.

An advance over the prior art is realized by incorporating a transducer comprising a non-resonant energy harvester into a wearable to power one or more devices, such as sensors, haptic devices, wireless communication devices, and the like, such that the energy harvester generates electrical energy when it (1) "flattens" in response to the application of a force and/or returns to its non-flat quiescent state when the applied force is removed. By configuring the energy harvester such that it functions substantially as a bending-strain-based device, it can generate significantly more power than those known in the prior art. Furthermore, some energy harvesters in accordance with the present disclosure employ a low dielectric-constant (K) or "low-K" piezoelectric material, which enables high-voltage/power operation and/or a significantly thinner energy harvester or sensor transducer.

An illustrative embodiment in accordance with the present disclosure is a smart shoe insole comprising a processor, an energy storage unit, a wireless communications module, a geolocation module, and plurality of pre-bent, multi-function, bending-strain-based, bimorph transducers. Each bimorph transducer includes three pre-bent, low-K piezoelectric transducer elements configured as a piezoelectric bending-strain-based energy harvester, a pressure sensor, and a haptic device.

In each bimorph transducer, the energy harvester is disposed on the front side of a stainless-steel substrate and the pressure sensor and haptic device are disposed on the backside of the substrate. The bimorph transducer is configured such that it has a non-planar quiescent shape and can bend out of this quiescent shape in response to a force applied to the transducer. In some embodiments, the substrate of a transducer comprises a material other than stainless steel.

In the illustrative embodiment, the piezoelectric material of each transducer element is magnetron-sputter-deposited low-K aluminum nitride (AlN), which enables high-voltage operation using a very thin piezoelectric layer. In some embodiments, at least one transducer element of a bimorph transducer comprises a different low-K piezoelectric material (e.g., scandium-doped AlN, undoped ZnO, doped zinc oxide (ZnO), polyvinylidene fluoride (PVDF), doped PVDF, lithium niobate ($LiNbO_3$), etc.). In some embodiments, the piezoelectric material is deposited by a suitable technique other than magnetron sputtering, such as non-magnetron sputtering, plasma-deposition technique, and the like.

In some embodiments, the piezoelectric material of at least one transducer element is a high-K material, such as Sol-gel lead-zirconate-titanate (PZT), thick doped Sol-gel PZT, and the like.

In some embodiments, a transducer is a monomorph that includes one or more transducer elements on only the top or bottom of a substrate.

In some embodiments, a transducer includes a substrate that comprises flanges at its ends, where the flanges are thicker than the thickness of the substrate outside of the flange region. The flanges are configured such that their larger surface area compresses a greater amount of resilient material surrounding the transducer when the transducer is flattened by an applied force. The compression of the resilient material develops a potential energy that gives rise to a restoring force on the transducer once the applied force is removed.

In some embodiments, the total operational thickness of a transducer in its quiescent state is within the range of approximately 1.5 mm to approximately 9 mm. In some embodiments, the total operational thickness of a transducer is less than or equal to 3.5 mm. In some embodiments, the total operational thickness of a transducer is within the range of 1.5 to 2.0 mm.

In some embodiments, a wearable includes one or more sensors that are external to the bimorph transducers, such as a pulse-oximetry sensor, an accelerometer, a gyroscopic sensor, a temperature sensor, a force, load, one or more pressure sensors, a haptic device, and the like.

An embodiment in accordance with the present disclosure is an apparatus comprising: a bending-strain-based transducer that includes: (i) a first transducer element disposed on a first surface of a substrate, the first transducer element being a non-resonant energy harvester; and (ii) a second transducer element disposed on a second surface of the substrate, the first and second surfaces being on opposite sides of the substrate, wherein the second transducer element is selected from the group consisting of a resonant energy harvester, a non-resonant energy harvester, a force sensor, a load sensor, a pressure sensor, and a haptic device; wherein the transducer has a quiescent shape that is non-planar.

Another embodiment in accordance with the present disclosure is an apparatus comprising a first bimorph transducer having a quiescent shape that is non-planar, wherein the first bimorph transducer includes a first transducer element disposed on a first surface of a substrate, the first transducer element being a non-resonant energy harvester, and wherein the first bimorph transducer is configured to bend in response to a first force.

Yet another embodiment in accordance with the present disclosure is a method comprising forming a first bending-strain-based transducer by operations that include: forming a first transducer element on a first surface of a substrate, the first transducer element including a first piezoelectric layer, wherein the first transducer element is configured as a non-resonant energy harvester; forming a second transducer element on a second surface of the substrate, the second transducer element including a first portion of a second piezoelectric layer and being selected from the group consisting of a non-resonant energy harvester, a sensor, and a haptic device; and providing the first bending-strain-based transducer with a quiescent shape that is non-planar.

BRIEF DESCRIPTION OF THE DRAWINGS

FIGS. 6A-B depict schematic drawings of simplified sectional views of a region of completed wearable 100 in its quiescent and deformed states, respectively.

FIG. 8 depicts a schematic drawing of a sectional view of an alternative arrangement of transducers within a wearable in accordance with the present disclosure.

FIGS. 10A-D depict schematic drawings of cross-sectional views of wearables having alternative arrangements of bimorph transducers within a wearable in accordance with the present disclosure.

DETAILED DESCRIPTION

Figure 1:
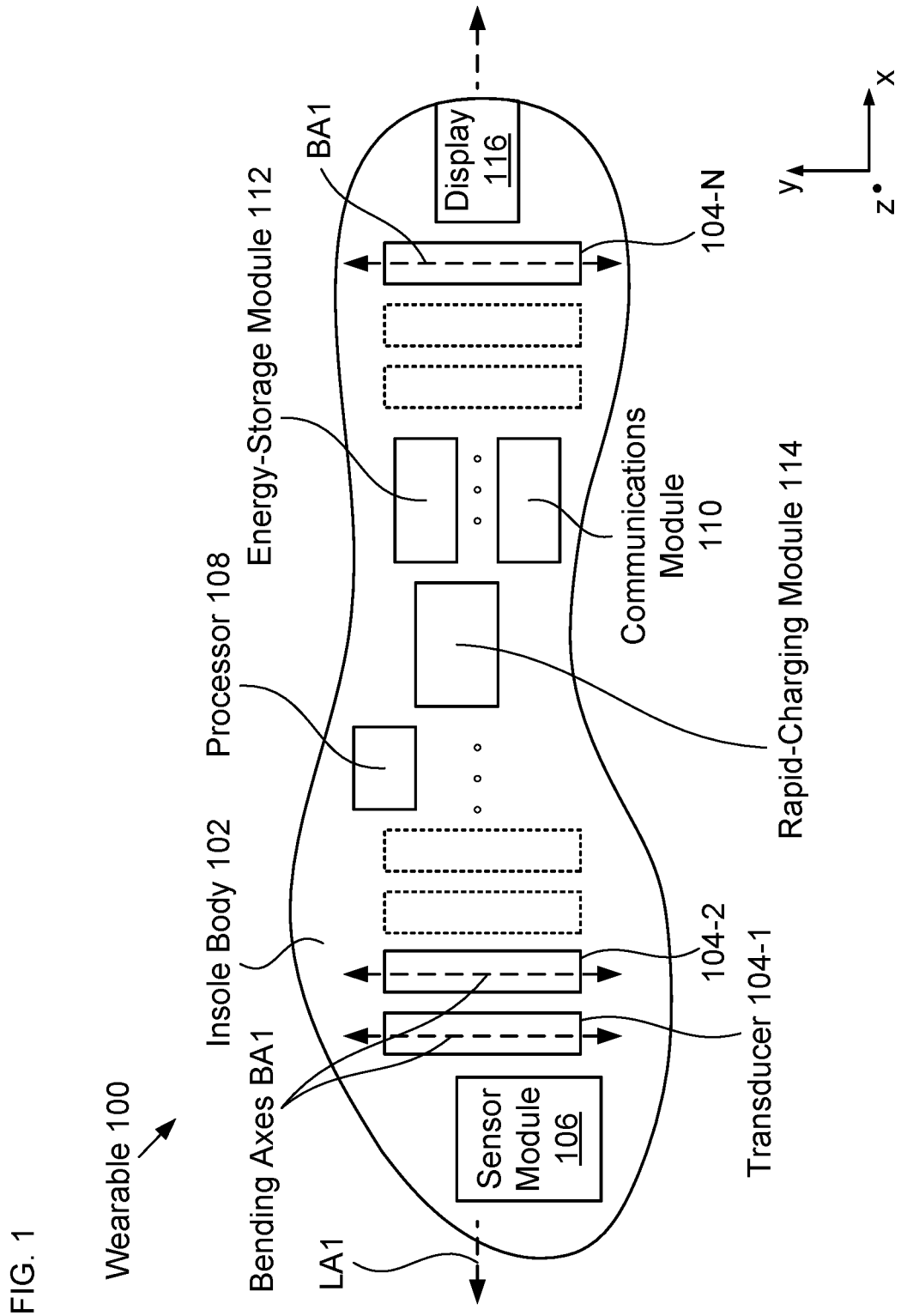
FIG. 1 depicts a schematic drawing of a plan view of an illustrative embodiment of a wearable in accordance with present disclosure.

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The functions of the various elements shown in the Drawing, including any functional blocks that may be labeled as "processors", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown.

Unless otherwise explicitly specified herein, the figures comprising the drawing are not drawn to scale.

The following terms are defined for use in this Specification, including the appended claims:

"sole member" is defined as a portion of shoe sole and, as used herein, can mean at least one of a shoe insole, a shoe midsole, and a shoe outsole.

"wearable" is defined as an object meant to be worn, used, and/or carried by a user where the object includes at least one transducer, such as a sensor, haptic device, etc., and where the user can be a human or an animal. A wearable, as used herein, includes garments, undergarments (e.g., bras, shoe soles, etc.), shoes, fashion electronics (e.g., fitness trackers, smart watches, etc.), accessories (e.g., backpacks, cell phone cases, purses, wallets, etc.), sporting equipment (e.g., fitness bands, etc.), horseshoes, leashes, tethers, collars, and the like.

"bending-strain-based transducer" is defined as a transducer that is configured to bend about a bending axis located in a plane in response to a force applied at least partially along a direction normal to that plane. For example, a normally flat bending-strain-based transducer lies in a first plane when in its quiescent state but will bend out of the first plane in response to the force, while a normally curved bending-strain-based transducer will become flatter, or completely flat, in response to the force. Bending of a bending-strain-based transducer in accordance with the present disclosure can manifest as an induced curvature that is substantially uniform across at least one lateral dimension of the device or as a localized bend that occurs at one or more localized points of the device, such as at a point of support for a cantilevered or doubly-supported element.

"non-resonant energy harvester" is defined as an energy harvester that does not require a driving force at or near its natural resonant frequency to generate voltage and/or electrical power. For example, a non-resonant energy harvester can generate voltage and/or electrical power in response to an aperiodic stimulus or the application of a substantially constant force.

"aligned" is defined as being co-linear or parallel with. For example, two elements that are aligned can either be arranged along the same axis or arranged such that they are parallel with one another.

"low-K piezoelectric material" is defined as a piezoelectric material having a dielectric constant that is less than or equal to 30 at room temperature.

"high-K piezoelectric material" is defined as a piezoelectric material having a dielectric constant that is greater than or equal to 100 at room temperature.

FIG. 1 depicts a schematic drawing of a plan view of an illustrative embodiment of a wearable in accordance with present disclosure. Wearable 100 is an orthotic shoe insole that can be reversibly inserted into a shoe. In the depicted example, wearable 100 comprises insole body 102, transducers 104-1 through 104-N, sensor module 106, processor 108, energy-storage module 110, communications module 112, rapid-charging module 114, and display 116.

It should be noted that, although the illustrative embodiment comprises a wearable that is a shoe insole, the teachings of the present disclosure can be applied to virtually any wearable suitable for use by a human, an animal, a robot, or as part of an exoskeleton. Furthermore, the teachings of the present disclosure, when applied to footwear (e.g., shoes, sneakers, cleats, slippers, socks, etc.), are not limited to reversibly insertable insoles but, rather, can be applied to myriad sole members, such as shoe insoles that are permanently joined to a shoe, outsoles, mid-soles (e.g., for high heel shoes, etc.), or to footwear that is, itself, a wearable comprising removable or non-removable non-resonant energy harvesters, sensors, and the like.

Figure 2:
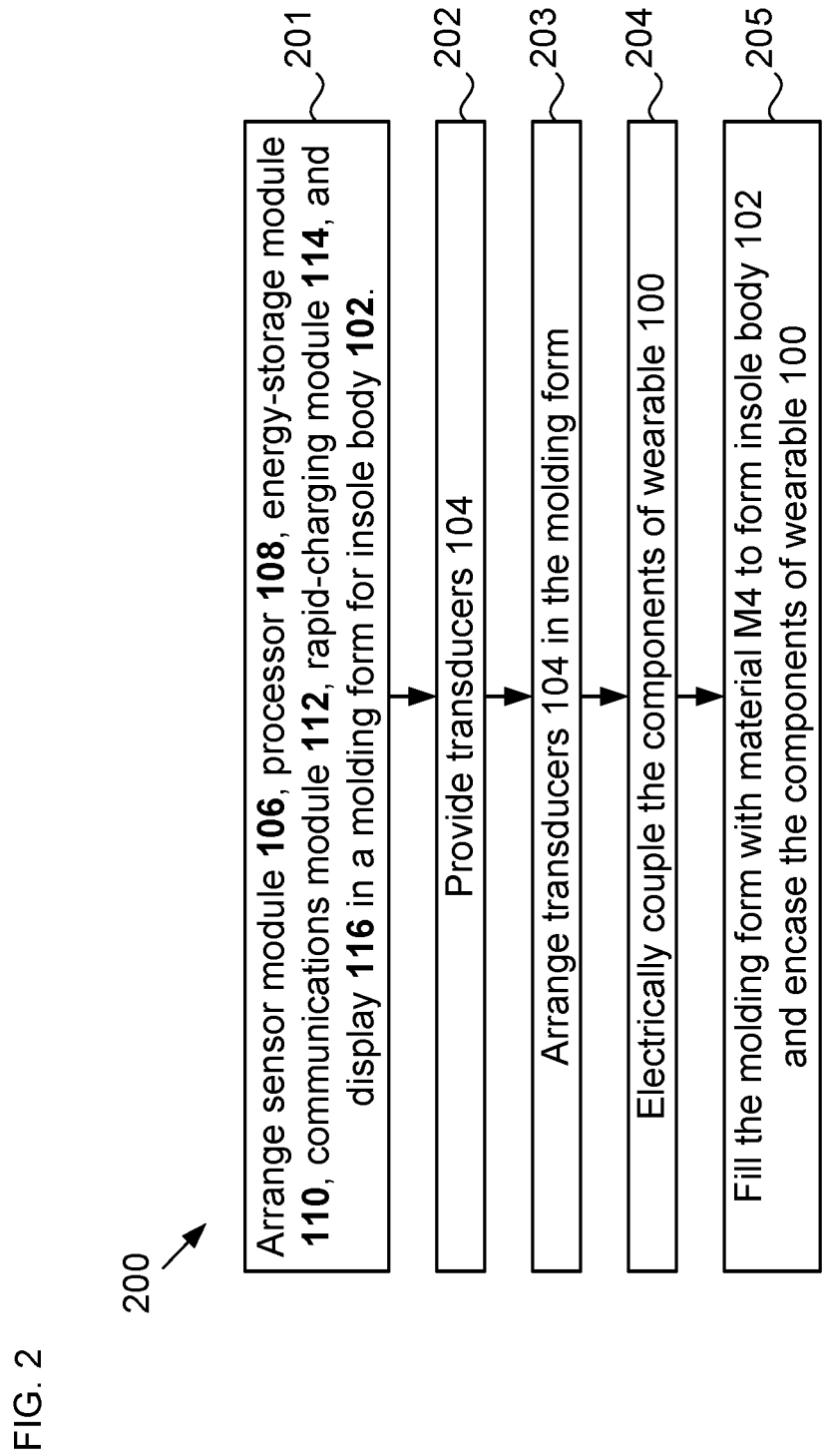
FIG. 2 depicts operations of a method for forming a wearable in accordance with present disclosure.

FIG. 2 depicts operations of a method for forming a wearable in accordance with present disclosure. Method 200 begins with operation 201, wherein sensor module 106, processor 108, energy-storage module 110, communications module 112, rapid-charging module 114, and an optional display 116 are arranged in a molding form suitable for the formation of insole body 102.

Insole body 102 is a conventional shoe insole comprising a resilient material suitable for providing cushioning to the user. Insole body 102 is a substantially "foot-shaped" body comprising material M1. Insole body 102 is characterized by longitudinal axis LA1, which is substantially aligned with the long dimension of the insole body (i.e., from the heel to the toes of the user, or vice versa).

Each of transducers 104-1 through 104-N (referred to, collectively, as transducers 104) is a multi-function bimorph transducer that includes a non-resonant energy harvester that is configured to operate in bending mode rather than compression. In the depicted example, each of transducers 104 includes a non-resonant energy harvester, a pressure sensor, and a haptic device for providing a sensory signal to the user. A representative transducer 104 is described in more detail below and with respect to FIGS. 3A-C.

Sensor module 106 includes one or more sensors for measuring user-based and/or environmental parameters other than pressure. Examples of sensors suitable for inclusion in sensor module 106 include, without limitation, temperature sensors, chemical sensors (e.g., oxygen sensors, humidity sensors, salinity sensors, electrolyte sensors, ion sensors, etc.), volatile organic compound (VOC) sensors for measuring ambient concentrations of "reducing gases" associated with air quality—e.g. alcohols, aldehydes, ketones, organic adds, amines, organic chloramines, aliphatic and aromatic hydrocarbons (e.g. for detection of the onset of "athletes foot" or other ailments), GPS sensors, accelerometers, gyroscopes, inertial sensors, optical sensors, including but not limited to pulse-oximetry sensors, carbon dioxide sensors, blood-alcohol sensors, glucose sensors, infrared (IR) temperature sensors, and the like.

In the depicted example, sensor module 106 includes a GPS system, a pulse-oximetry sensor, and a multi-axis accelerometer. The GPS system provides location and elevation information to processor 108 and transmits and receives information to/from communications module 110.

The pulse-oximetry sensor provides user-centric data to processor 108, such as heart rate and blood oxygen level.

Respiratory rate and burned calories can be calculated from heart rate. It is known that the respiratory rate calculation is accurate, yet the burned calories of contemporary wearable smart watches using this conversion technique are known to be inaccurate.

The multi-axis accelerometer enables wearable 100 to detect walking, running, skipping, etc., as well as calculation of burned calories by the human or animal body with an accuracy that greater exceeds the accuracy possible in the prior art. The aforementioned heart rate calculation method is used in combination with the multi-axis accelerometer to obtain these superior results via a computer software algorithm.

It is an aspect of the present disclosure that calorie burning can be determined with higher accuracy than possible in the prior art because transducer 100 enables measurement of the actual mechanical power expended, where $P=(\text{force } F=\text{mass } m*\text{acceleration } a_{x,\,y\,or\,z})*(\text{speed } S=a_{x,\,y\,or\,z}*\text{time } t)$, which can then be converted to human power (or animal power) using a known conversion factor to determine calories burned with less than 5% inaccuracy. Prior-art systems use only the measured heart rate to calculate burned calories, which has been found to be 27% to 93% inaccurate.

The multi-axis accelerometer also enables wearable 100 to detect potentially catastrophic events, such as a fall by the user, as well as assess user behavior, such as after a fall has been detected. For example, the accelerometer enables detection of a lack of movement (potentially indicating a state of unconscious), rapid, random movements (potentially indicating onset of a seizure), movements indicative of crawling (e.g., to call for help, etc.), as well as other user-centric behavior, such as when the user is lying down, etc.

In some embodiments, a second, external multi-axis accelerometer (e.g., located in a wrist band, a chest band, a garment, a smart watch, a fitness tracker, etc.) is used in conjunction with wearable 100 to provide additional information regarding upper body movements. Such an arrangement enables better determination of the calories burned by the upper body, providing improved accuracy for overall calorie-burn calculations.

In some embodiments, the location of the pulse-oximetry sensor, IR temperature sensor or other optical sensor within wearable 100 is carefully selected relative to advantageously position it relative to the blood vessels (e.g., arteries carrying oxygen-laden red blood cells) in the body portion of the user with which it is to be operatively coupled.

Processor 108 includes processing circuitry, control circuitry, memory, and the like, that is configured to, among other things, send and receive signals to/from transducers 104 and sensor module 106, execute instructions, analyze and store data, and transmit and receive signals to/from communications module 112. In the depicted example, the processor is implemented as a single, discrete component within wearable 100; however, in other embodiments, the processor can be distributed, at least in part, among multiple components in wearable 100, implemented, in part or in full, in a remote or cloud-based computing system, or otherwise implemented in a suitable arrangement for carrying out the functions described herein. In some embodiments, some or all of the capability of processor 108 is incorporated into communications module 110.

Communications module 110 is configured to enable wireless communications to and from wearable 100. In some embodiments, communications module 110 employs one or more communications systems, such as Bluetooth® low-energy (BLE) communications system, LoRa, long-range cellular, satellite, Bluetooth®, WiFi, Zigbee, A-wave, radio frequency (RF), and the like. In the depicted example, communications module 110 includes a LoRa communications system and a Bluetooth® low-energy (BLE) communications system. The LoRa communications system is configured to transmit and receive GPS data to/from wearable 100 via cellular communications networks, while the BLE system is configured to communicate with processor 108 and other components within wearable 100. In the depicted example, the BLE system is also configured to communicate with a base station, such as a dedicated base station or a mobile device running a dedicated app for interfacing to wearable 100.

It should be noted that the relatively larger amount of space available in an insole than, for example, in a mobile phone, enables the communications antennae of communications module 110 to be designed to enable better reception and more consistent transmission to/from their respective paired devices.

It is an aspect of the present disclosure that the inclusion of a GPS system in sensor module 106 and a communications module that communicates with a mobile device, such as a cell phone, tablet, etc., enables high-level functionality, such as computer applications that enable location of a wearable at any time, or an alarm when a distance between the wearable and base station or mobile device exceeds a threshold. This is particularly useful for locating a user that might require assistance (e.g., a missing child, a "wandering" lost Alzheimer's patient, an intoxicated user, a missing camper/hiker/skier, a lost animal, a missing robot, etc.).

Energy-storage module 112 includes power-handling circuitry (e.g., AC to DC rectification, etc.) and one or more energy storage units. Energy-storage module 112 is operatively coupled with each of transducers 104 and configured to store energy generated by their respective non-resonant energy harvesters, as well as provide power to the transducers and the other electronics included in wearable 100. In the depicted example, energy-storage module 112 includes a lithium-polymer battery suitable for storing enough charge for several hours/days of normal use. In some embodiments, energy-storage module 112 includes one or more super capacitors and/or a different energy-storage device, such as a rechargeable battery, a rechargeable standard capacitor, a hybrid-system of a primary battery and/or a rechargeable battery and/or a super capacitor and/or a capacitor, and the like.

Rapid-charging module 114 is optionally included in wearable 100 and includes an interface for electrically coupling to an external power source to rapidly charge the energy storage units of energy-storage module 112. In the depicted example, rapid-charging module 114 includes an inductive-charging coil sub-system and associated circuitry. In some embodiments, the rapid-charging module includes a different interface that enables electrical connection to an external power source.

Display 116 is optionally included in wearable 100 to enable visual determination of the state of the wearable, such as charge level, etc. In the depicted example, display 116 includes a plurality of LEDs; however, other display elements can be used in display 116 without departing from the scope of the present disclosure.

At operation 202, transducers 104 are provided.

Figures 3A, 3B:
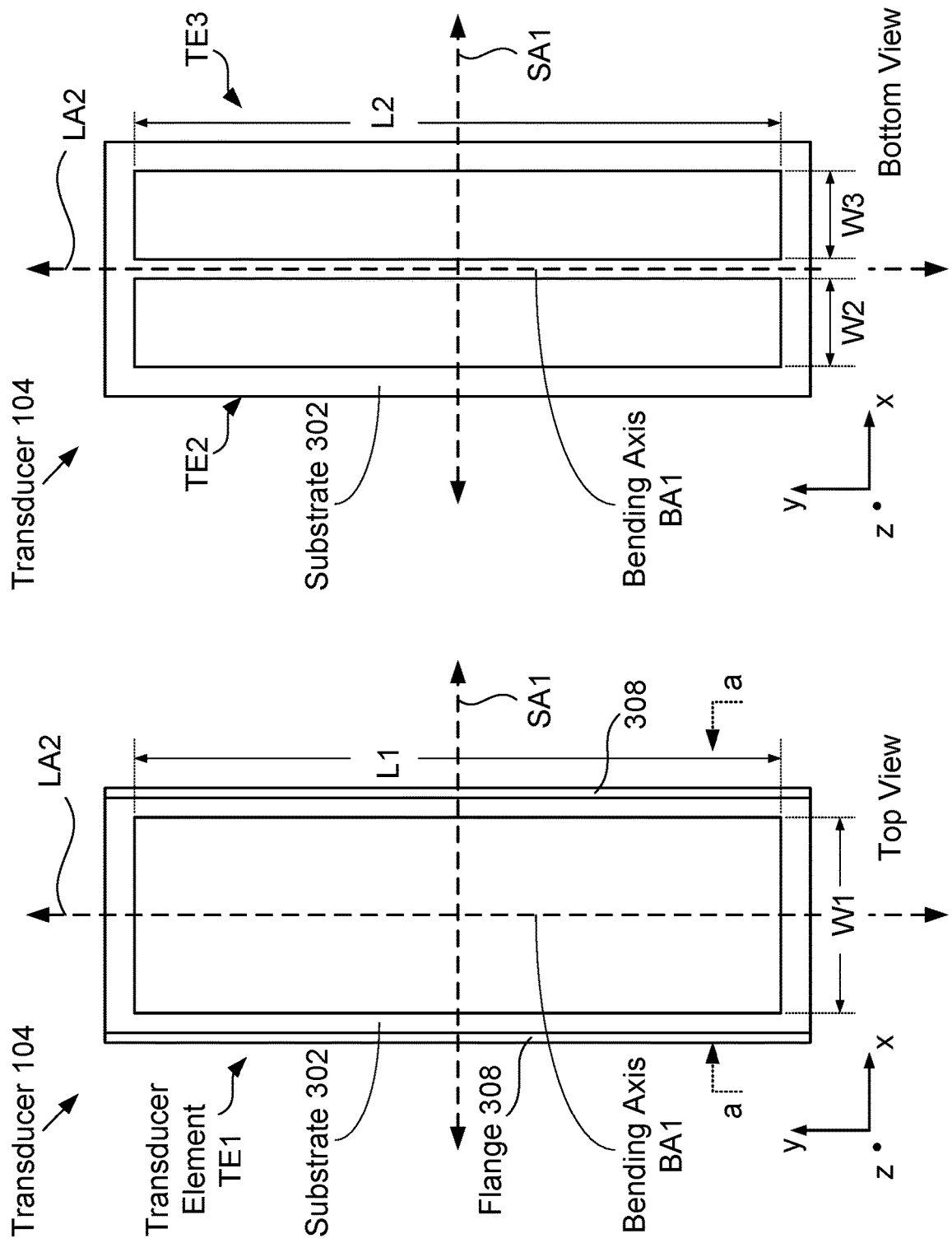
FIGS. 3A-C depict schematic drawings of top, bottom, and cross-sectional views, respectively, of a representative transducer 104 in accordance with the illustrative embodiment.

FIGS. 3A-B depict schematic drawings of simplified top and bottom views, respectively, of a representative transducer 104 in accordance with the illustrative embodiment.

Figure 3C:
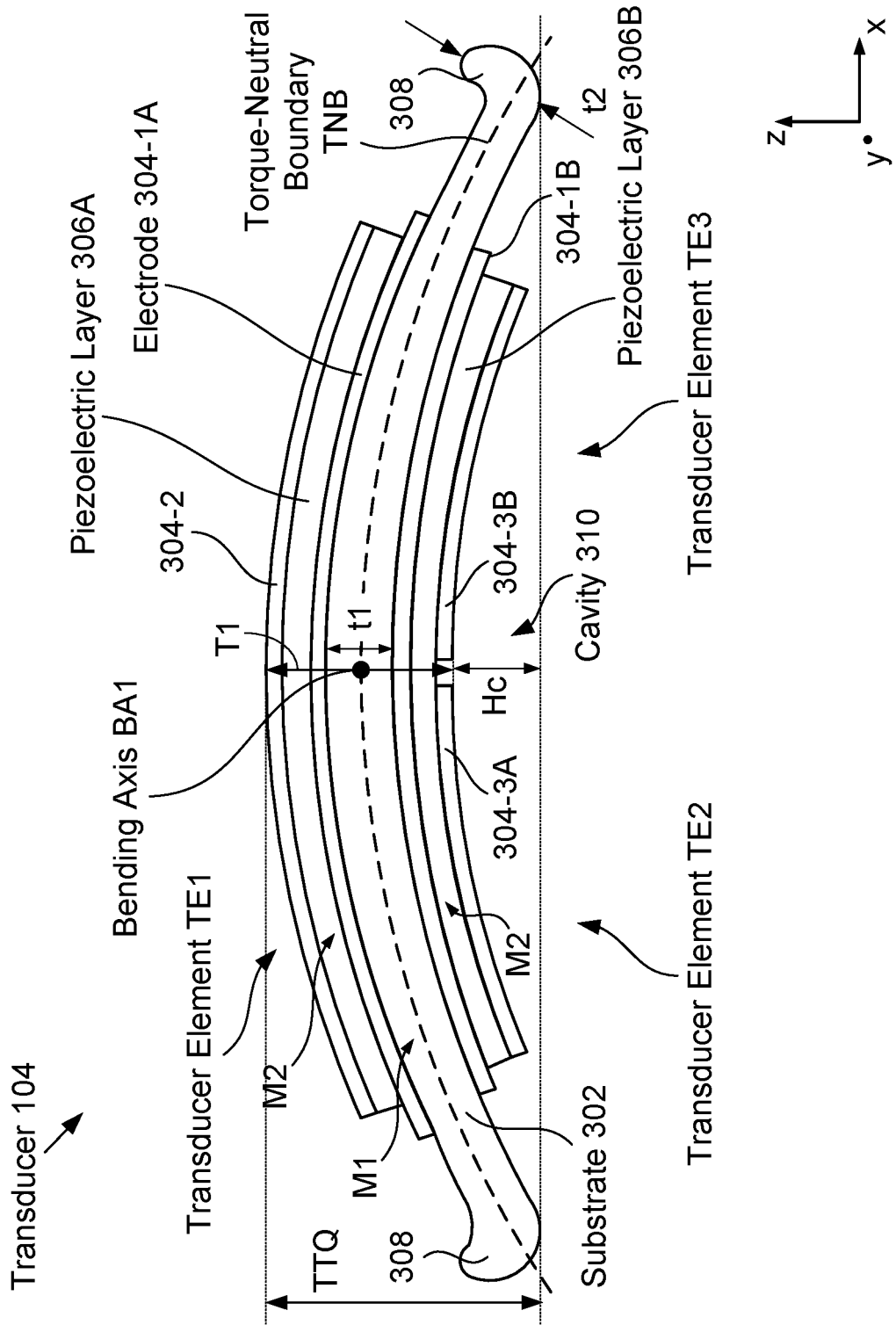

FIG. 3C depicts a schematic drawing of a detailed sectional view of the layer structure of transducer 104 in accordance with the illustrative embodiment. The sectional view shown in FIG. 3C is taken through line a-a, as indicated in FIG. 3A.

Transducer 104 includes substrate 302 and transducer elements TE1, TE2, and TE3. Transducer element TE1 is disposed on the top surface of substrate 302, and transducer elements TE2 and TE3 are disposed on the bottom surface of substrate 302, collectively forming a bimorph-transducer structure. Because the physical configuration of transducer element TE1 is substantially equivalent to that of the combination of transducer element TE2 and TE3, the structure is balanced about substrate 302 and transducer 104 is characterized by torque-neutral boundary TNB, which runs through the center of the substrate.

Transducer 104 is configured as a "ridge transducer" having a non-planar quiescent shape that curved along one dimension (the x-dimension in the depicted example), thereby forming a ridge along an orthogonal dimension (i.e., the y-dimension), as well as a cavity beneath the ridge. The ridge of transducer 104 is substantially aligned with bending axis BA. In some embodiments, transducer 104 has a cross-section along at least one dimension that is described by a known curved shape, such as sinusoidal, parabolic, catenary, and the like.

It is an aspect of the present disclosure that a piezoelectric transducer having a quiescent shape that is non-planar affords significant advantages over prior-art piezoelectric transducers, such as:
  improved reliability due to inherent overstress limit; or
  increased restoring force; or
  increased energy generation for a given force; or
  any combination of i, ii, and iii.

Although the illustrative embodiment includes rectangular piezoelectric transducers, in some embodiments, at least one piezoelectric transducer in a wearable has a non-rectangular shape. In some embodiments the non-rectangular shape (e.g. circular) piezoelectric transducers may be used as a force sensor (e.g. step-counter) or as a haptic device or both.

In some embodiments, transducer is configured as a concave (or convex disc) that is radially symmetric about its center point that defines a peak (or center of a valley).

In some embodiments, transducer 104 is a ruffled transducer having a series of ridges and furrows aligned with one dimension. In some embodiments, transducer 104 is shaped such that it is ruffled in two dimensions (i.e., has peaks and valleys along two dimensions (e.g., the x- and y-dimensions), thereby defining a "waffle-like" structure. In some such embodiments, the shape of transducer is defined such that strain is distributed substantially evenly along at least one dimension.

Transducer element TE1 is configured as a non-resonant energy harvester and includes electrodes 304-1A and 304-2 and piezoelectric layer 306A. Transducer element TE1 is configured to generate electrical energy in response to deformation of piezoelectric layer 306A out of its quiescent shape due to an applied force.

Transducer element TE2 is configured as a pressure sensor and includes electrodes 304-1B, 304-3A, and a first portion of piezoelectric layer 306B. Transducer element TE2 is configured to provide an electrical signal whose magnitude is based on the amount of strain induced in the region of piezoelectric layer 306B between electrodes 304-1B and 304-3A by the bending of substrate 302 in response to the applied force. As a result, the electrical signal provided by transducer element TE2 is indicative of the magnitude of applied force F.

Transducer element TE3 is configured as a haptic device and includes electrodes 304-1B, 304-3B, and a second portion of piezoelectric layer 306B. Transducer element TE3 is configured to generate a vibration signal that is perceptible to the user of wearable 100 in response to a drive signal provided by processor 108. As a result, transducer 100 can provide signals to the user in the case of potential foot slippage, a potential mis-step, detected body-balance issues, as part of behavioral retraining during, for example, physical therapy after a stroke, a wake-up alarm, and the like. In some embodiments, haptic devices are arranged around the perimeter of the foot to enable their use as directional stimuli for helping vision-impaired persons safely navigate through a landscape. In some embodiments, the haptic devices are operatively coupled with a voice-controlled handheld mobile device, or alarm to, for example, provide an audible warning if the user is about to walk into a street intersection with automobiles passing or across train tracks, and the like.

Although the illustrative embodiment includes a multi-function transducer having energy harvesting, sensing, and haptic feedback capabilities, in some embodiments, transducer 104 includes only non-resonant energy harvesters, only a non-resonant energy harvester and a sensor, or only a non-resonant energy harvester and a haptic device.

Figure 4:
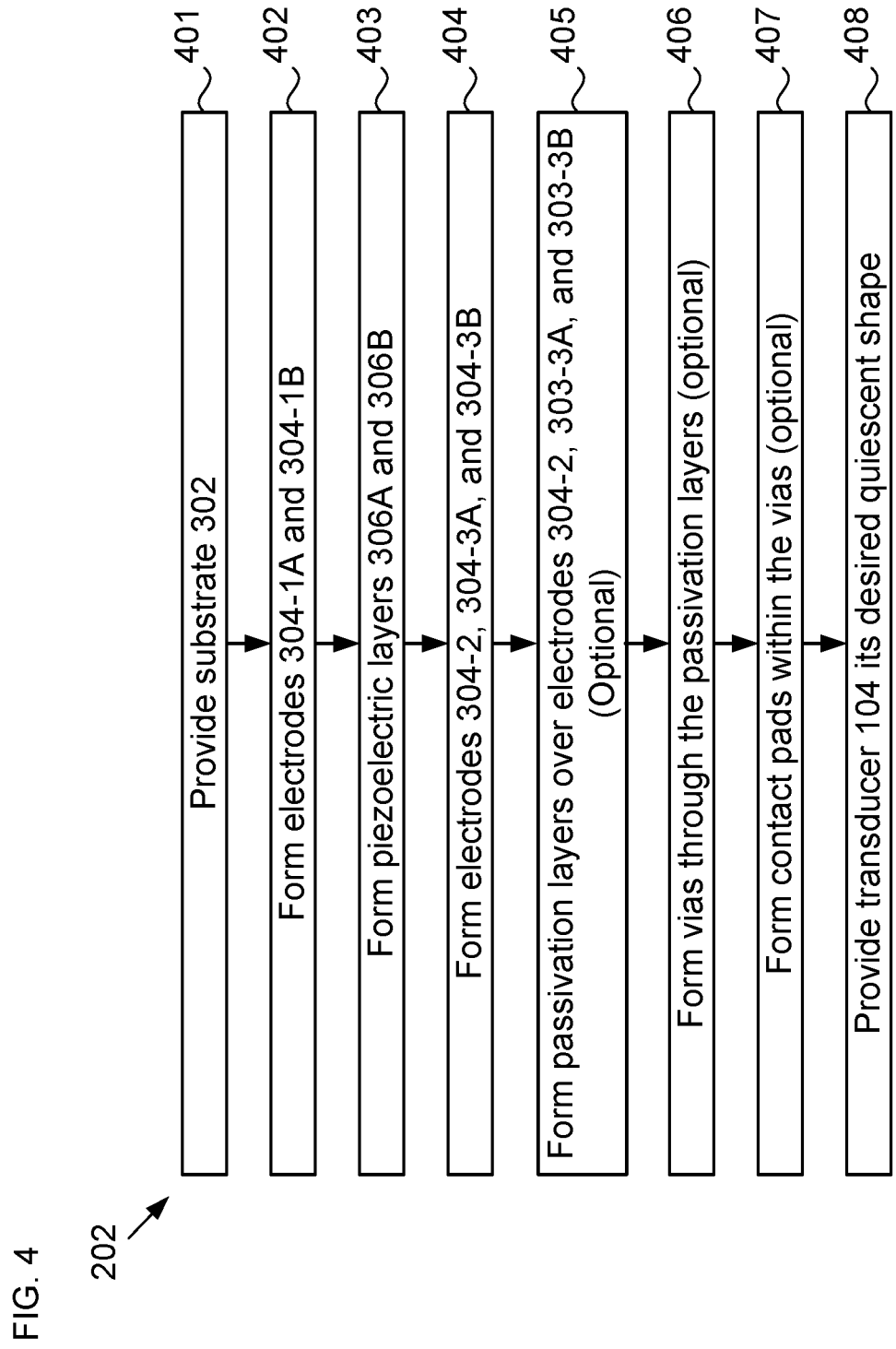
FIG. 4 depicts sub-operations suitable for forming a transducer in accordance with the present disclosure.

FIG. 4 depicts sub-operations suitable for forming a transducer in accordance with the present disclosure. Operation 202 begins with sub-operation 401, wherein substrate 302 is provided.

Substrate 302 is a flexible substrate suitable for planar processing methods. Substrate 302 comprises a layer of material M1 having thickness, t1.

Material M1 is selected to provide a desired combination of flexibility, yield strength, and plastic-deformation point. As discussed below, in order to form a pre-bent transducer, such as transducer 104, the plastic-deformation point of material M1 must be less than or equal to the yield strength of the material included in piezoelectric layers 306A and 306B. As a result, the piezoelectric layers deposited on the substrate will not fracture when the substrate is deformed from its initial planar configuration into its quiescent non-planar shape. It is an aspect of the present disclosure that a transducer whose substrate has a plastic deformation point that is within the range of approximately 70% to approximately 80% of the fracture stress point of its piezoelectric material affords particular advantages over the prior art.

The thickness, t1, of substrate 302 depends on the choice of material M1 and is typically within the range of approximately 10 microns to approximately 1.5 mm; however, a thickness within the range of approximately 200 microns to approximately 750 microns is preferable for many applications.

In the depicted example, material M1 is sintered stainless steel having a Young's modulus ($E_y$) of approximately 190 MPa and a plastic-deformation point of approximately 1400 MPa. It should be noted that sintered stainless steel can have a plastic-deformation point of up to 1500 MPa depending on sintering temperature and time. As a result, in some embodiments, M1 has a different plastic-deformation point that is less than or equal to 1500 MPa.

The choice of stainless steel and, in particular, sintered stainless steel as material M1 enables the thickness of substrate 302 to be very thin compared to most alternative materials. The minimum value for t1 is dictated by a need for substrate 302 to generate sufficient restoring force when deformed to enable it to return fully to its quiescent state once the applied force is removed. The maximum value of t1 is dictated by a need to enable the substrate to deform fully in response to a reasonable amount of applied force. For a transducer that is intended for use in an insole and whose substrate comprises sintered stainless steel, for example, a suitable value for t1 is typically within the range of 500 microns to approximately 1.5 mm. In the depicted example, t1 is equal to 600 microns.

In some embodiments, M1 comprises a different material and/or substrate 302 has a different thickness, t1. Materials suitable for use in substrate 302 include, without limitation, low-Young's modulus materials (e.g., polyimides, polydimethylsiloxane (PDMS), plastics, etc.), moderate-Young's modulus materials (e.g., flexible glasses, Corning Willow® glass, etc.), and high-Young's modulus materials (e.g., metals (e.g., brass, copper, etc.), composite materials, and the like). It should be noted that the use of a different substrate material will not change the output voltage/power/energy of a symmetric bimorph transducer having the same design in every other respect, since the torque-neutral axis or boundary TNB and resulting strain of the piezoelectric layers remain unchanged.

It should be noted that the use of a metal, such as stainless steel, sintered stainless steel, brass, copper, etc., for substrate 302 affords embodiments in accordance with the present disclosure significant advantages over the prior art, including an ability to match the yield strengths of the substrate material and that of the piezoelectric layers, low cost, well-known production methods, and most metals can be sawed, diced, laser cut, water-jet cut, etc. without requiring exotic methods. Furthermore, most metals suitable for use in substrate 302 are available in sheets suitable for use in large production environments, such as large area flat panel or roll-to-roll manufacture.

At optional sub-operation 402, electrodes 304-1A and 304-1B are formed on the top and bottom surfaces, respectively of substrate 302.

Although not shown in FIG. 3C (for clarity), adhesion layers are typically deposited on the top and bottom surfaces of substrate 302 prior to the formation of electrodes 304-1A and 304-1B. Such adhesion layers normally have a thickness of less than 1000 nm and typically are 100 nm or less and comprise the same material as that of piezoelectric layers. In some embodiments, these adhesion layers comprise an alternate metal, such as titanium or molybdenum, as discussed in detail in parent application U.S. patent application Ser. No. 17/373,690. Using titanium (Ti), molybdenum (Mo) or other conduction material as the adhesion layer allows for electrical connection from lower electrodes 304-1A and 304-1B to the metal substrate 302, which may be more manufacturable to electrically connect to by external wiring post fabrication.

Electrodes 304-1A and 304-1B are layers of conductive material suitable for providing electrical connectivity to piezoelectric layers 306A and 306B, respectively. In the depicted example, each of electrodes 304-1A and 304-1B is a layer of sputter-deposited molybdenum (Mo) having a thickness of approximately 2 microns. Preferably, each electrode has a thickness within the range of approximately 100 nm to approximately 2 microns.

It should be noted that the material and thickness used for the electrodes is a matter of design choice and is affected by the choice of material M2 used for piezoelectric layers 306A and 306B. For example, sputtered PZT is preferably deposited on copper or copper alloys (e.g. brass). In each of these cases (AlN or PZT), the aforementioned electrode metals yield the best polycrystalline orientation, which yields the best piezoelectric coefficients $d_{ij}$ (i or j=1, 2 or 3 or equivalently x, y or z), voltage and power/energy output. Yet, provided adequate adhesion can be realized, any metal can be used for the electrodes.

At sub-operation 403, piezoelectric layers 306A and 306B are formed on electrodes 304-1A and 304-1B, respectively.

Each of piezoelectric layers 306A and 306B is a layer of piezoelectric material M2 having a yield strength that exceeds the plastic-deformation point of substrate 302. Typically, each of piezoelectric layers 306A and 306B has a thickness that is within the range of approximately 0.1 microns to approximately 10 microns; however, thicknesses of up to several hundred microns can be used for at least one of piezoelectric layers without departing from the scope of the present disclosure. It is preferable that both piezoelectric layers 306A and 306B are equal in thickness so that the torque neutral boundary (or axis) is located at the center of the substrate 302. Such a configuration yields substantially optimal output voltage and power/energy generation. Preferably, material M2 is a low-K piezoelectric material.

In the depicted example, piezoelectric layers 306A and 306B are sputter-deposited layers of undoped aluminum nitride (AlN) having a thickness of approximately one micron. Preferably, the thickness of undoped aluminum nitride used in piezoelectric layers 306A and 306B is within the range of approximately 0.1 to approximately 4.0 microns (provided adhesion of such layers is sufficient to ensure long-term reliability).

In some embodiments, piezoelectric layers 306A and 306B comprise sputtered scandium-doped aluminum nitride (ScAlN), which can have a Young's modulus that is reduced by as much as 20% from that of undoped AlN by up to 20%, making it more flexible. As a result, ScAlN is particularly attractive for use as material M2 in some embodiments because it gives rise to larger piezoelectric coefficients $d_{ij}$ (up to 2.5×) for the same deformation as compared to undoped AlN.

Furthermore, as will be apparent to one skilled in the art, after reading this Specification, to first order, the voltage, V, generated by a piezoelectric layer is proportional to $(d_{31}/K)$ and the power, P, generated is proportional to $(d_{31}^2/K)$. Since output voltage is proportional to $d_{ij}$ and $E_y$, and output power is proportional to $d_{ij}^2$ and $E^2$, increased energy harvesting can be achieved using the same thickness piezoelectric layers, thereby enabling more voltage/power/energy generation and more flexibility and/or low-profile effectively thinner transducers. However, the introduction of scandium (and associated defects) into AlN can also reduce the fracture point of material M2 below the plastic deformation point of material M1, which would reduce the maximum curvature that could be imparted on transducer 106.

The use of undoped aluminum nitride or scandium-doped aluminum nitride in piezoelectric layers 306A and 306B affords embodiments in accordance with the present disclosure significant advantages over transducers and wearables known in the prior art, including:
higher voltage and power/energy generation capability; or
higher yield strength; or
significantly lower bending profile; or
increased flexibility; or
differentially matched yield strength with a steel substrate allowing for fabricating pre-bent structures post AlN or ScAlN deposition; or
environmental friendliness (no lead content, as opposed to PZT); or
any combination of i, ii, iii, iv, v, and vi.

It should be noted that, although undoped aluminum nitride or scandium-doped aluminum nitride is preferred for material M2, other piezoelectric materials can be used for at least one of piezoelectric layers 306A and 306B without departing from the scope of the present disclosure. Materials suitable for use in accordance with the present disclosure include, without limitation, thin, magnetron sputtered, low-K piezoelectric materials (e.g., undoped zinc oxide (ZnO), doped ZnO, undoped polyvinylidene fluoride (PVDF), doped PVDF, chromium-doped AlN, yttrium-doped AlN, lithium niobate (LiNbO$_3$), etc.), thick high-K piezoelectric materials (e.g., undoped Sol-gel lead zirconate titanate (PZT), doped Sol-gel PZT, etc.), and the like.

Dopants suitable for inclusion in piezoelectric layers 306A and/or 306B include, without limitation, strontium, lanthanum, iron, barium, niobium, europium, cerium oxide, lithium aluminum, sodium, potassium, boron, graphene, trifluoro ethylene, zinc oxide, nitrogen, magnesium, magnesium oxide, scandium, chromium, yttrium, silver, tin, and lithium, as well as combinations thereof.

Although it is preferable that material M2 is a low-K piezoelectric material, material M2 can comprise a high-K piezoelectric material without departing from the scope of the present disclosure. For example, in some embodiments, one or both of piezoelectric layers 306A and 306B comprises a very thick (e.g. 25 to 250 or more microns) layer of Sol-gel lead-zirconate-titanate (PZT) or doped Sol-gel PZT. Such a layer can be formed, for example, by spin coating, extrusion, lamination, etc. The significantly greater thickness of such a layer can compensate for the high dielectric constant of these materials (PZT has a K in the range of 1700-3500, for instance), which would normally lead to low voltage and poor power generation.

Furthermore, deposition methods other than sputter deposition can be used to form one or both of piezoelectric layers 306A and 306B without departing from the scope of the present disclosure. Alternative deposition methods suitable for forming piezoelectric layers 306A and 306B include, without limitation, Sol-gel coating, chemical-vapor deposition (CVD), plasma-enhanced chemical vapor deposition (PECVD), wet-chemical processing, doctor-blade deposition, spin coating, and the like.

At sub-operation 404, electrode 304-2 is formed on piezoelectric layer 306A and electrodes 304-3A and 304-3B are formed on piezoelectric layer 306B. Electrodes 304-2, 304-3A, and 304-3B are analogous to electrodes 304-1A and 304-1B described above.

As will be apparent to one skilled in the art, the dimensions of electrodes 304-2, 304-3A, and 304-3B define the sizes of transducer elements TE1, TE2, and TE3, respectively. As a result, transducer element TE1 has width W1 and length L1, transducer element TE2 has width W2 and length L2, and transducer element TE3 has width W3 and length L2. As will be apparent to one skilled in the art, the values of L1, L2, W1, W2, and W3 depend upon the application for which transducer 104 is intended. In the depicted example, wearable 104 is an insole configured to fit within a women's shoe, which normally has an approximately 7-cm width. As a result, each of L1 and L2 is 6 cm, width W1 is 3 cm, and widths W2 and W3 are 2.75 cm. In some embodiments, wearable 100 is an insole configured for insertion into a men's shoe, which has an approximately 9-cm width, enabling transducer lengths of approximately 8 cm.

In some embodiments, electrode 304-2 comprises two discontinuous electrode portions that are separated by a small gap such that they are electrically disconnected. In some such embodiments, an electrically conductive jumper is formed to electrically connect the two electrode portions. When electrically connected via a jumper, the two electrode portions substantially function as one complete electrode on the top of piezoelectric layer 306A.

At optional sub-operation 405, passivation layers (e.g., silicon oxide, silicon nitride, polyimide, etc.) are formed over electrodes 304-1A, 304-1B, 304-2, 304-3A, and 304-3B. Typically, the passivation layers have a thickness within the range of approximately 0.5 micron to approximately 3 microns. In the depicted example, the passivation layers are PECVD-deposited silicon nitride having thickness of approximately 1 micron.

At optional sub-operation 406, vias are formed through the passivation layers to enable access to each of at least one of electrodes 304-1A, 304-1B, 304-2, 304-3A, and 304-3B.

At optional sub-operation 407, contact pads are formed in the vias to enable electrical connections to be made to at least one of electrodes 304-1A, 304-1B, 304-2, 304-3A, and 304-3B.

As noted above, the use of certain low-K piezoelectric materials (e.g., undoped aluminum nitride or scandium-doped aluminum nitride, etc.) enables a very thin transducer to generate more voltage/power/energy. It is an aspect of the present disclosure that the transducer thickness, T1, of transducer 104 (as depicted in FIG. 3C) can be kept within the range of approximately 10 microns to approximately 1.6 mm, while still generating sufficient output for many applications. As a result, embodiments in accordance with the present disclosure are better suited than prior-art transducers for some wearable applications, such as shoe-sole elements, bras, etc., where a transducer thicker than a few millimeters would be noticeable and could even cause discomfort. In the depicted example, the transducer thickness, T1, of transducer 104 is approximately 612 microns.

At sub-operation 408, transducer 104 is provided its quiescent non-planar shape.

In the depicted example, transducer 104 is formed into a "u-shaped" channel having flanged edges by heating it above the glass-transition point of substrate 302 and applying mechanical force to "press" the transducer into its desired quiescent shape. Once formed, transducer 104 defines underlying cavity 310.

In its quiescent state, the total transducer height TTQ of transducer 104 is equal to the sum of transducer thickness T1 and the cavity height, Hc, of cavity 310.

It is an aspect of the present disclosure that the non-planar quiescent shape into which transducer 104 can be formed is limited only by the yield strength of material M2, as long as:
  the material of piezoelectric layers 306A and 306B and electrodes 304-1A, 304-1B, 304-2, 304-3A, and 304-3B have melting points that are greater than the glass-transition point of the substrate; and
  the plastic-deformation point of the substrate material (i.e., M1) is less than or equal to the yield strength of the material (i.e., M2) of the piezoelectric layers.

However, there are several other factors that inform the desired values for T1 and Hc, as well as the material choices for substrate 302, piezoelectric material M2, and electrodes 304. These factors are, in large part, dictated by the application for which a transducer is intended.

For example, when transducer 104 is intended for use in an insole, it is desirable that TTQ be small enough to avoid user discomfort during use, thereby placing an upper bound on transducer thickness T1 and/or cavity height Hc. At the same time, a transducer must be able to develop sufficient restoring force when deformed by force F to enable it to return to its quiescent state when the force is removed (e.g., when the user's foot lifts during walking, even if the shoe is tied very tightly). In addition, preferably, a transducer exhibits maximum deformation, without undergoing plastic deformation, in response to the applied force so that it generates as much electrical energy as possible.

As discussed below and with respect to FIGS. 6A-B, typical practical values for TTQ are within the range of approximately 1.5 mm to approximately 9.5 mm for transducers designed for use in an insole. In the depicted example, wearable 100 is an orthotic insole and TTQ is approximately 3.5 mm; however, TTQ can have any practical value without departing from the scope of the present disclosure.

Flanges 308 are located at the lower edges of substrate 302. Flanges 308 are configured such that they have more surface area to compress the material of insole body 102 when transducer 104 is deformed by an applied force. In the depicted example, flanges 308 are portions of the substrate that are "rolled" inward such that they have thickness t2, which is greater than the thickness of the rest of the substrate (i.e., t1). As a result, flanges 308 As discussed in more detail below and with respect to FIGS. 6A-B, the increased surface area of flanges 308 increases the amount of material displaced along the x-direction when transducer 104 is flattened, thereby increasing the potential energy stored by the insole-body material, which is typically resilient. As a result, flanges 308 increase the magnitude of a lateral restoring force on the transducer that arises as the transducer is flattened.

In some embodiments, transducer 104 is formed into its non-planar quiescent shape via a different conventional method, such as die stamping, etc.

Returning now to method 200, in operation 203, transducers 104 are arranged in the molding form for insole body 102. In the depicted example, transducers 104 are arranged in a substantially linear arrangement in which the short axis, SA1, of each transducer is substantially aligned with longitudinal axis LA1 of insole body 102. As a result, the arrangement of transducers can "roll up" along longitudinal axis LA1 (like a venetian blind) as insole 102 deforms during a stride of the user.

Although the depicted example includes a plurality of substantially identical transducers 104 that is arranged in a linear arrangement within wearable 100, a plurality of transducers within a wearable can include different transducers and/or be arranged in any practical one-, two-, or three-dimensional arrangement without departing from the scope of the present disclosure. For example, a smart connected insole in accordance with the present disclosure can include a plurality of transducers 104 having a shorter length, or circular transducers, etc., in the narrower instep region of the insole. Some non-limiting examples of alternative transducer arrangements are disclosed in detail in parent application U.S. patent application Ser. No. 17/373,690.

At operation 204, the components within wearable 100 are electrically connected such that power is provided by the non-resonant energy harvesters of transducers 104 via energy storage module 112.

Figure 5:
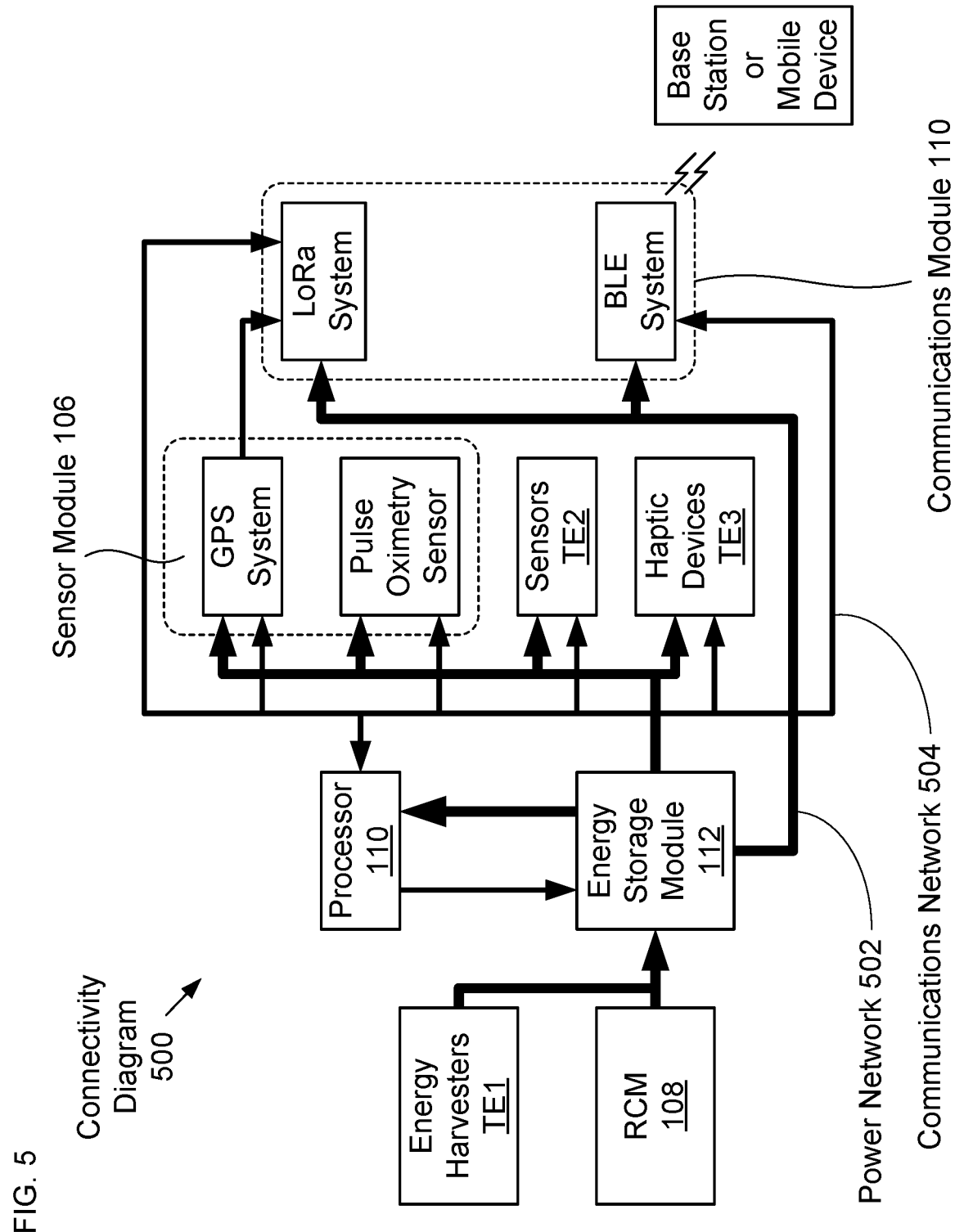
FIG. 5 depicts a block diagram showing component connectivity for a wearable in accordance with the present disclosure.

FIG. 5 depicts a block diagram showing component connectivity for a wearable in accordance with the present disclosure.

As seen in connectivity diagram 500, wearable 100 includes two substantially independent networks—power network 502 and communications network 504.

In power network 502, energy storage module 112 receives energy from each of rapid-charging module 108 and the non-resonant energy harvesters TE1 included in the plurality of transducers 104 and distributes the energy, as needed, to other components within wearable 100, including processor 108, sensor module 106, the force/load/pressure sensors TE2 included in the plurality of transducers 104, the haptic devices TE3 included in the plurality of transducers 104, and communications module 110.

In communications network 504, energy data and control signals are transmitted between processor 108 and the components in sensor module 106, communications module 110, and energy storage module 112.

At operation 205, insole body 102 is formed by filling the mold to fully encase transducers 104-1 through 104-N, sensor module 106, processor 108, communications module 110, energy-storage module 112, rapid-charging module 114, and display 116. By fully encasing these components within the insole, they are substantially protected from damage due to water, sweat, and the like. In some embodiments, display 116 is encased within insole body 102 such that its display elements are visible to the user when desired.

FIGS. 6A-B depict schematic drawings of simplified sectional views of a region of completed wearable 100 in its quiescent and deformed states, respectively. The sectional views of transducer 104 are taken through line a-a, as depicted in FIG. 3A.

In the depicted example, insole body 102 includes a pair layers of material having different mechanical properties—HD layer 602, which is located below transducers 104, and LD layer 604, which completely surrounds the transducers and electrical components. Preferably, HD layer 602 is formed prior to operation 201. When transducer 104 is in its quiescent state, HD layer 602 has thickness THD and LD layer 604 has thickness TLD.

HD layer 602 comprises material M3, which has a relatively higher density, while LD layer 604 comprises material M4, which has a relatively lower density. In the depicted example, material M3 is a high-density polyurethane (PU) and material M4 is a low-density polyurethane; however, a wide range of materials are suitable for use in either of HD layer 602 and LD layer 604.

It is an aspect of the present disclosure that the two-layer structure of insole body 102 fosters bending-strain-based operation of transducers 104. It should be noted, however, that one or both of materials M3 and M4 can include any suitable material, such as a monolayer of polyurethane, mono- or multi-layers of viscoelastic gels, neoprene rubbers, foams, and the like without departing from the scope of the present disclosure.

As will be apparent to one skilled in the art, insole thickness can vary over quite a large range, depending upon the specific type of insole. The preferred thicknesses of HD layer 602 and LD layer 604, therefore, are based on the particular type of insole application for which wearable 100 is intended.

Table 1 below shows approximate thicknesses in the heel and ball areas of the foot for different types of conventional insoles.

TABLE 1

Representative dimensions for typical insole types.

| Type of Conventional Insole | Thickness at Heel (mm) | Thickness at Ball of Foot (mm) |
|---|---|---|
| Orthotic | 10 | 4.5 |
| Non-orthotic | 3.5 | 2.5 |
| Military Boot | 3.5 | 2.5 |
| Sports Shoe | 3 | 2 |

The total operational thickness, TTO, of transducer 104 within wearable 100 is equal to the sum of THD and the total quiescent thickness TTQ (i.e., transducer thickness, T1 and the height, Hc, of cavity 310 when the transducer is in its quiescent shape). As noted above, wearable 100 is an orthotic insole, which sets an upper bound on the value of TTO. In the depicted example, TLD is approximately 1 mm, THD is 2 mm, T1 is approximately 0.612 mm, and Hc is approximately 0.9 mm (i.e., TTQ is approximately 1.5 mm), resulting in a TTO of only 2.5 mm; however, these values are merely exemplary and matters of design. As a result, TLD, THD, T1, and Hc can have any practical values without departing from the scope of the present disclosure. Furthermore, in some embodiments, transducers having different values of TTO are used in the heel and ball of foot regions.

When wearable 100 is subjected to force F (e.g., when foot pressure is applied to the insole), the applied force flattens the structure of transducer 104, thereby bending the transducer out of its quiescent shape to make it "flatter" and longer (in the x-direction). This bending of the transducer reduces its curvature about bending axis BA.

It should be noted that the curved shape of transducer 104 mitigates compression of piezoelectric layers 306A and 306B, themselves, in response to force F. In some embodiments, standoffs, such as posts, reside within the piezoelectric layers to mitigate their compression in response to an applied force. As will be appreciated by one skilled in the art, after reading this Specification, compression of a piezoelectric layer configured to operate in bending mode is undesirable, as it negatively affects the bending response of the transducer. Specifically, the output signal from a piezoelectric element is proportional to the charge it builds up in response to strain. While a piezoelectric element responds to bending with a negative charge buildup, while it responds to compression with a positive charge buildup. As a result, any compression of a bending-mode piezoelectric element will cancel out at least some, if not all, of its response to bending. Embodiments in accordance with the present disclosure, therefore, are afforded advantages over the prior art.

In some embodiments, transducer 104 includes features that project from one or both of its major surfaces to inhibit compression of piezoelectric layers 306A and 306B. In some embodiments, transducer 104 is mounted in a seat that inhibits compression of piezoelectric layers 306A and 306B. Some non-limiting examples of structures suitable for facilitating bending-mode operation of a piezoelectric transducer while simultaneously inhibiting compression of its piezoelectric materials are disclosed in detail in parent application U.S. patent application Ser. No. 17/373,690.

When transducer 104 is flattened, material M4 beneath the transducer is compressed. Since M4 is a resilient material, it provides restoring force RF1 that acts to return the transducer to its quiescent state once force F is removed.

In addition, as noted above, substrate 302 is configured such that its ends are shaped into flanges 308 which have greater surface area in the y-z plane. As a result, more material M4 is displaced along the x-direction when transducer 104 elongates as it is flattened. This laterally displace material M4 gives rise to additional restoring force RF2, thereby augmenting restoring force RF1.

Flanges 308 provide additional advantage because they reduce the chance of damage due to substrate 302 cutting into LD layer 504 or abrading HD layer 502, thereby improving the lifetime and reliability of wearable 100.

As noted above, the choices of materials and thicknesses of substrate 302 and piezoelectric layers 306A and 306B typically depend upon the application for which a transducer is designed and the desired performance parameters of the transducer. For example, the design of the depicted example can provide substantially maximum generation of energy per user step—even with a TTO of only 1.5-2.0 mm. In some cases, however, less energy generation is required, allowing for more latitude in transducer design. For example, a transducer having a 1000-micron-thick brass substrate, 200-micron-thick piezoelectric layers comprising PZT sol-gel material, and having a TTO of 4 millimeters can produce significant energy when employed in an orthotic insole.

Figure 7A:
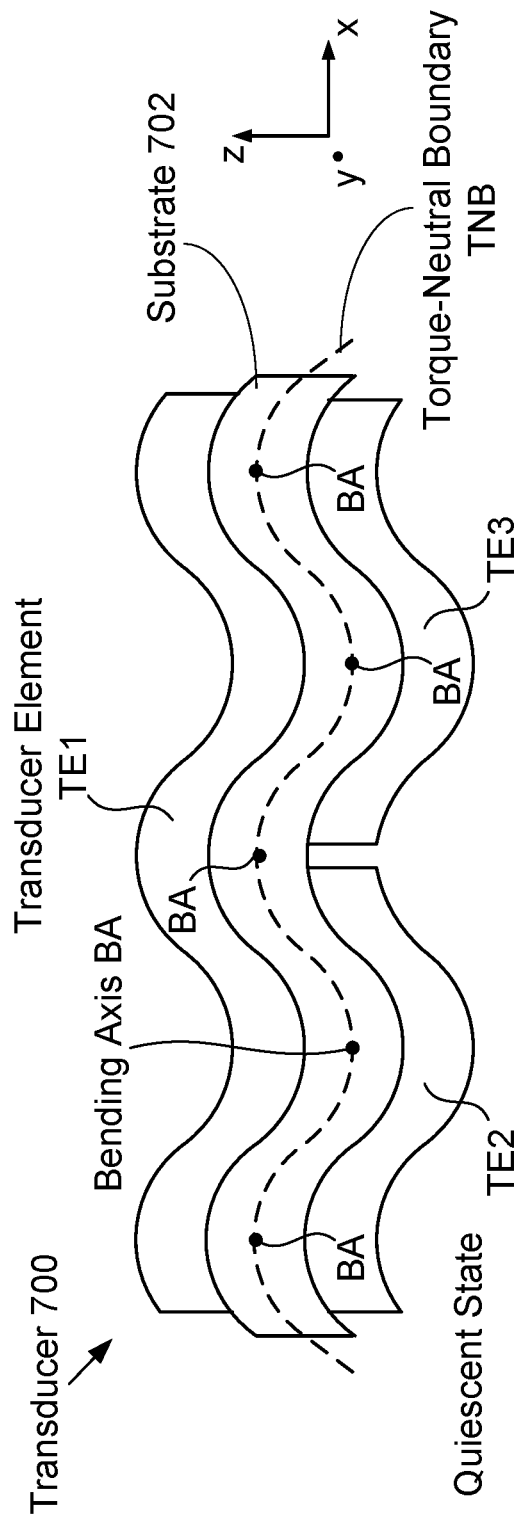
FIGS. 7A-B depict schematic drawings of sectional views of an alternative embodiment of a transducer, in its quiescent and deformed states, in accordance with the present disclosure.
Figure 7B:
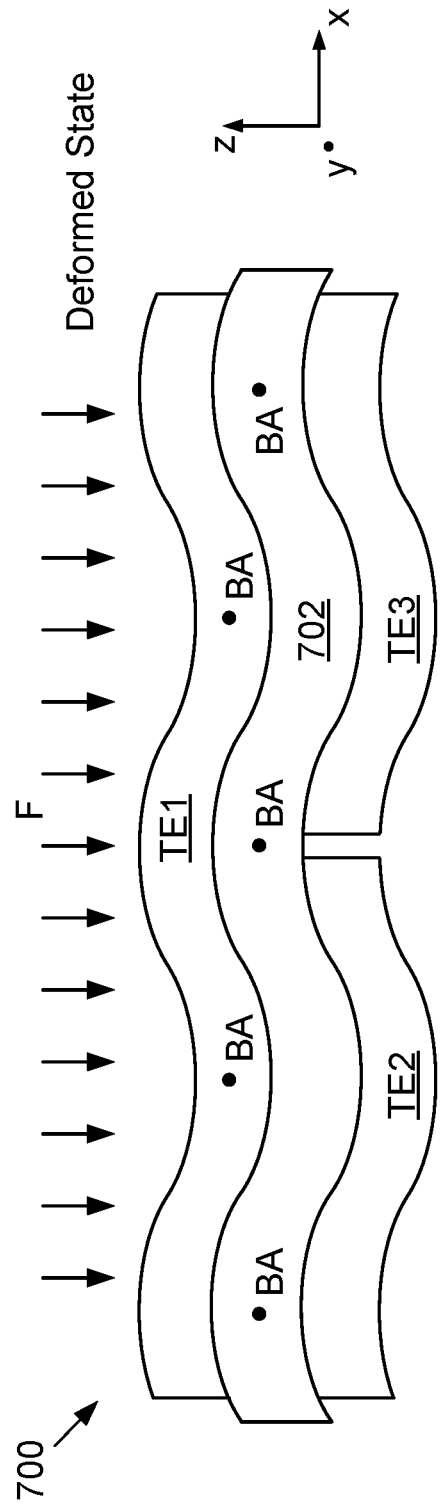

FIGS. 7A-B depict schematic drawings of sectional views of an alternative embodiment of a transducer, in its quiescent and deformed states, in accordance with the present disclosure. Transducer 700 is analogous to transducer 104; however, in transducer 700, substrate 702 is configured such that transducer 700 has a plurality of peaks and valleys arranged along the x-dimension when in its quiescent state, thereby giving rise to a "ruffled transducer."

Each peak and valley of transducer 700 is substantially aligned with a different bending axis BA. In some embodiments, a ruffled transducer is shaped such that it has peaks and valleys along two dimensions (e.g., the x- and y-dimensions). In some embodiments, a ruffled transducer has a cross-section having a known curved shape along at least one dimension, such as sinusoidal, parabolic, catenary, and the like. In some such embodiments, the shape of transducer is defined such that strain is distributed substantially evenly along at least one dimension.

FIG. 8 depicts a schematic drawing of a sectional view of an alternative arrangement of transducers within a wearable in accordance with the present disclosure. Wearable 800 includes transducers 700A and 700B, plates 802A and 802B, and material M4.

Plates 802A and 802B are substantially rigid plates of structural material (e.g., metal, plastic, etc.), which are configured to substantially uniformly transfer an applied force to transducers 700A and 700B.

Wearable 800 is configured such that each of transducers 700A and 700B will be compressed by force F, thereby substantially doubling the magnitude of the output signals from their transducer elements.

In some embodiments, transducer 104 is configured such that an applied force causes it to stretch and/or bend like a cantilever element in one or more dimensions. A stretchable transducer is particularly well-suited for use in wearable applications such as an energy-scavenging strap that powers a bra, a belt, a chest strap, stretchy pants, a backpack, and the like.

Figure 9A:
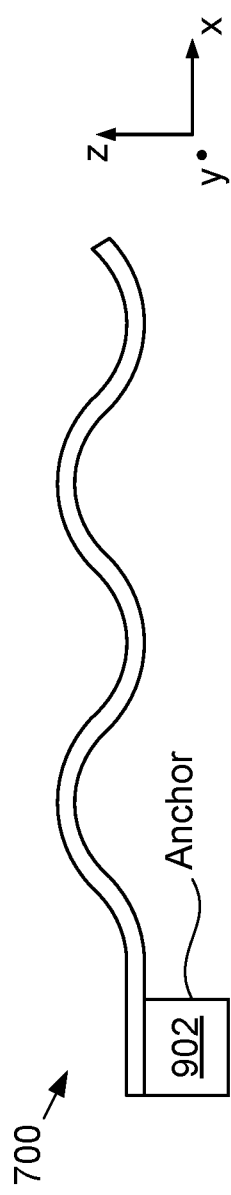
FIGS. 9A-C depict schematic drawings of cross-sectional views of a cantilevered ruffled transducer under different force conditions in accordance with the present disclosure.
Figure 9B:
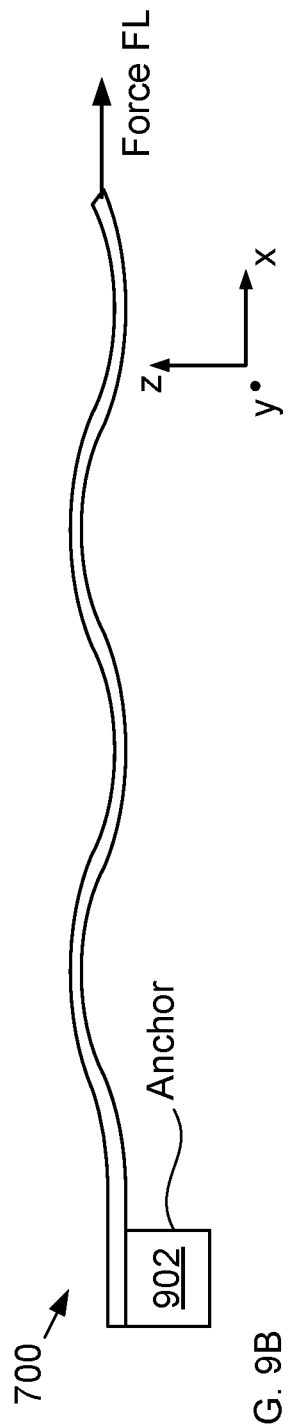
Figure 9C:
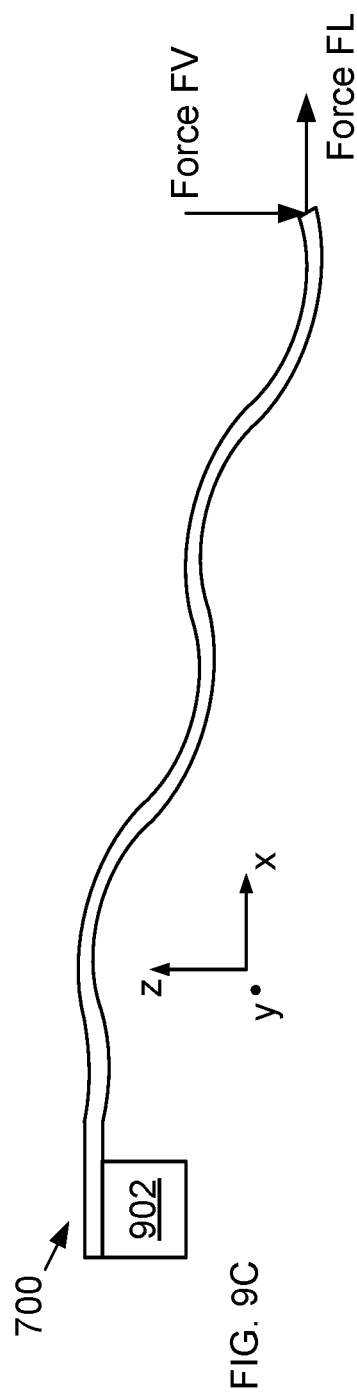

FIGS. 9A-C depict schematic drawings of cross-sectional views of a cantilevered ruffled transducer under different force conditions in accordance with the present disclosure.

In FIG. 9A, transducer 700 is depicted in its quiescent state while affixed to anchor 902. In other words, transducer 700 is depicted without any applied force.

In FIG. 9B, transducer 700 is depicted in a stretched state in response to applied force FL, which is a lateral force directed only along the x-direction. As transducer 700 is stretched along the x-axis, the transducer is deformed from its quiescent shape by being pulled into a flatter profile.

In FIG. 9C, transducer 700 is depicted in a stretched state in response to applied forces FL and FV, which are lateral and vertical forces directed along the x- and y-directions, respectively.

FIGS. 10A-D depict schematic drawings of cross-sectional views of wearables having alternative arrangements of bimorph transducers within a wearable in accordance with the present disclosure. Each of wearables 1000, 1002, 1004, and 1006 is analogous to wearable 100 and comprises insole body 102 and one or more transducers analogous to transducer 104. It should be noted that, for clarity, only transducers 104 and their respective bending axes are shown in FIGS. 10A-D.

Wearable 1000 includes transducer 104A, which is a long version of transducer 104 and arranged within insole body 102 such that bending axis BA1A is aligned with longitudinal axis LA1. As a result, transducer 104A can generate voltage and energy in response to a rolling motion of the user's foot, as well as during each step as the shoe meets the ground or lifts from it.

Wearable 1002 includes a pair of transducers 104B, each of which is a short version of transducer 104. Transducers 104B are arranged within insole body 102 such that each of their bending axes BA1B is aligned with longitudinal axis LA1. Although the depicted example includes two transducers that are displaced from longitudinal axis LA1, in some embodiments, the bending axis of at least one transducer is colinear with the longitudinal axis of its wearable.

Wearable 1004 includes a combination of transducers that includes one transducer 104A and a pair of transducers 104B. Transducers 104A and 104B are arranged within insole body 102 such that each of their bending axes BA1A and BA1B is aligned with longitudinal axis LA1.

Wearable 1006 includes a plurality of transducers 104B, which is arranged within insole body 102 such that each of their bending axes BA1A and BA1B is aligned with longitudinal axis LA1. The arrangement of transducers includes two linear arrays located approximately at the heel and ball-and-foot areas of the insole body, as well as a single transducer 104B located near the arch region of the insole body.

In some embodiments, a wearable includes transducers whose bending axes are aligned along different directions (e.g., some along the x-axis and some along the y-axis, at different angles with respect to at least one of the x- and y-axes, etc.). In some embodiments, a wearable includes a mixture of transducer types, such as any combination of ruffled, waffled, channel, and/or circular transducers.

It is to be understood that the disclosure teaches just some exemplary embodiments and that many variations of the invention can easily be devised by those skilled in the art after reading this disclosure and that the scope of the present invention is to be determined by the following claims.

What is claimed is:

1. A wearable apparatus comprising:
   (a) a bending-strain-based transducer having a longitudinal axis that defines a first direction, that includes:
      (i) a first transducer element disposed on a first surface of a substrate, the first transducer element being a non-resonant energy harvester; and
      (ii) a second transducer element disposed on a second surface of the substrate, the first and second surfaces being on opposite sides of the substrate, wherein the second transducer element is selected from the group consisting of a resonant energy harvester, a non-resonant energy harvester, a force sensor, a load sensor, a pressure sensor, and a haptic device;
      (iii) a mechanically rigid structural support aligned with a second direction, the first transducer element having a third surface that is distal to the substrate and defines a first plane, and wherein the mechanically rigid structural support extends along the second direction to define a second plane, and further wherein the first plane is between the substrate and the second plane; wherein the mechanically rigid structural support functions as a fulcrum about which the transducer bends;
   (b) a power handling circuit; and
   (c) an energy storage module operatively coupled with the bending-strain-based transducer and configured to store energy generated by the non-resonant energy harvesters, and provide power to the bending-strain-based transducer and the other electronics included in the wearable apparatus;
   wherein the bending-strain-based transducer has a quiescent shape that is non-planar.

2. The wearable apparatus of claim 1 wherein the transducer has a longitudinal axis in a first direction and is configured to bend in response to a first force that is at least partially directed along a second direction that is orthogonal to the first direction, and wherein the bending strain transducer is further configured to inhibit compression of at least one of the first and second transducer elements in response to the first force.

3. The wearable apparatus of claim 1 wherein the bending strain transducer has a transducer thickness that is less than or equal to 3 millimeters.

4. The wearable apparatus of claim 3 wherein the bending strain transducer thickness is within the range from 10 microns to 1100 microns.

5. A wearable apparatus comprising:
   (a) a bending-strain-based transducer having a longitudinal axis that defines a first direction that includes:
      (i) a first transducer element disposed on a first surface of a substrate, the first transducer element being a non-resonant energy harvester; and
      (ii) a second transducer element disposed on a second surface of the substrate, the first and second surfaces being on opposite sides of the substrate, wherein the second transducer element is selected from the group consisting of a resonant energy harvester, anon-resonant energy harvester, a force sensor, a load sensor, a pressure sensor, and a haptic device;
      (iii) a third transducer element disposed on the second surface, and wherein the third transducer element is a sensor or a haptic device;
      (iv) a mechanically rigid structural support aligned with a second direction, the first transducer element having a third surface that is distal to the substrate and defines a first plane, and wherein the mechanically rigid structural support extends along the second direction to define a second plane, and further wherein the first plane is between the substrate and the second plane; wherein the mechanically rigid structural support functions as a fulcrum about which the transducer bends;
   (b) a power handling circuit; and
   (c) an energy storage module operatively coupled with the bending-strain-based transducer and configured to store energy generated by the non-resonant energy harvesters, and provide power to the bending-strain-based transducer and the other electronics included in wearable apparatus;
   wherein the bending-strain-based transducer has a quiescent shape that is non-planar.

6. The wearable apparatus of claim 1 wherein the wearable apparatus is a sole member.

7. The wearable apparatus of claim 1 wherein the substrate comprises a material selected from the group consisting of a metal, a polyimide and a glass.

8. The wearable apparatus of claim 1 wherein at least one of the first transducer element and second transducer element includes a piezoelectric layer comprising a low-K piezoelectric material.

9. The wearable apparatus of claim 8 wherein the low-K piezoelectric material is selected from the group consisting of undoped aluminum nitride, doped aluminum nitride, scandium-doped aluminum nitride, undoped zinc oxide, doped zinc oxide, and polyvinylidene fluoride.

10. The wearable apparatus of claim 1 wherein the substrate comprises steel and at least one of the first transducer element and second transducer element includes a piezoelectric layer comprising a material selected from the group of undoped aluminum nitride, doped aluminum nitride, and scandium-doped aluminum nitride.

11. The wearable apparatus of claim 1 wherein the substrate includes at least one flange, and wherein the substrate has a first thickness and the flange has a second thickness that is greater than the first thickness.

12. A wearable apparatus comprising a first bimorph transducer having a quiescent shape that is non-planar, wherein the first bimorph transducer includes a first transducer element disposed on a first surface of a substrate, the first transducer element being a non-resonant energy harvester, and wherein the first bimorph transducer is configured to bend in response to a first force, wherein the wearable apparatus further comprises:
    (a) a mechanically rigid structural support aligned with a second direction, the first transducer element having a third surface that is distal to the substrate and defines a first plane, and wherein the mechanically rigid structural support extends along the second direction to define a second plane, and further wherein the first plane is between the substrate and the second plane; wherein the mechanically rigid structural support functions as a fulcrum about which the transducer bends;
    (b) a power handling circuit; and
    (c) an energy storage module operatively coupled with the first bimorph transducer and configured to store energy generated by the non-resonant energy harvesters, and provide power to the first bimorph transducer and the other electronics included in the wearable apparatus;
    wherein the first bimorph transducer further includes a second transducer element disposed on a second surface of a substrate, the second transducer element being a haptic device.

13. The wearable apparatus of claim 12 wherein the first bimorph transducer is further configured to inhibit compression of the first transducer element in response to the first force.

14. The wearable apparatus of claim 12 wherein the substrate comprises at least one material selected from the group consisting of a metal, a polyimide, and a glass.

15. The wearable apparatus of claim 12 wherein at least one of the first transducer element and second transducer element includes a piezoelectric layer comprising a low-K piezoelectric material selected from the group consisting of undoped aluminum nitride, doped aluminum nitride, scandium-doped aluminum nitride, undoped zinc oxide, doped zinc oxide, and polyvinylidene fluoride.

16. The wearable apparatus of claim 12 wherein the substrate comprises steel and at least one of the first transducer element and second transducer element includes a piezoelectric layer comprising a material selected from the group of undoped aluminum nitride, doped aluminum nitride, and scandium-doped aluminum nitride.

17. The wearable apparatus of claim 12 wherein the wearable is a shoe insole that includes:
    a plurality of bimorph transducers that includes the first bimorph transducer;
    a wireless communications module;
    wherein the plurality of bimorph transducers is operatively coupled with each of the power-handling circuit and the energy-storage module.

18. The wearable apparatus of claim 12 wherein the quiescent shape is a ruffled shape that includes a plurality of bending axes arranged along a first direction.

19. The wearable apparatus of claim 12 wherein the substrate includes at least one flange, and wherein the substrate has a first thickness and the flange has a second thickness that is greater than the first thickness.

* * * * *